US 7,439,775 B2

(12) United States Patent
Sohn

(10) Patent No.: US 7,439,775 B2
(45) Date of Patent: Oct. 21, 2008

(54) SENSE AMPLIFIER CIRCUIT AND SENSE AMPLIFIER-BASED FLIP-FLOP HAVING THE SAME

(75) Inventor: Young-Soo Sohn, Gunpo-si (KR)

(73) Assignee: Samsung Electronics Co., Ltd., Suwon-si, Gyeonggi-do ( * ) Notice: Subject to any disclaimer, the term of this patent is extended or adjusted under 35 U.S.C. 154(b) by 2 days.

(21) Appl. No.: 11/735,694

(22) Filed: Apr. 16, 2007

(65) Prior Publication Data

US 2007/0285131 A1 Dec. 13, 2007

(30) Foreign Application Priority Data

Apr. 28, 2006 (KR) .................. 10-2006-0038633
Jun. 14, 2006 (KR) .................. 10-2006-0053305

(51) Int. Cl.
*G01R 19/00* (2006.01)
*G11C 7/00* (2006.01)
*H03F 3/45* (2006.01)

(52) U.S. Cl. .................. 327/55; 327/217; 327/218

(58) Field of Classification Search .................. 327/55, 327/217, 218
See application file for complete search history.

(56) References Cited

U.S. PATENT DOCUMENTS

| | | | |
|---|---|---|---|
| 6,081,153 A | 6/2000 | Hamada et al. | |
| 6,147,514 A | 11/2000 | Shiratake | |
| 6,184,772 B1 | 2/2001 | Kawase et al. | |
| 6,424,181 B1 | 7/2002 | Pogrebnoy | |
| 6,617,885 B2 | 9/2003 | Lim et al. | |
| 6,833,737 B2 | 12/2004 | Aipperspach | |
| 6,967,883 B2 | 11/2005 | Hira et al. | |
| 2001/0005150 A1 | 6/2001 | Eum | |
| 2002/0017927 A1 | 2/2002 | Sugio | |
| 2004/0008068 A1* | 1/2004 | Kim | 327/218 |
| 2005/0007842 A1 | 1/2005 | Nakashima | |
| 2006/0152269 A1* | 7/2006 | Marutani | 327/218 |

* cited by examiner

*Primary Examiner*—Kenneth B. Wells
*Assistant Examiner*—John W Poos
(74) *Attorney, Agent, or Firm*—F. Chau & Associates, LLC

(57) ABSTRACT

A sense amplifier-based flip-flop includes a first latch, a second latch, a floating reduction unit, an input signal applying unit, a ground switch and a delay reduction unit. The first latch outputs a signal to a first output terminal pair, and outputs an evaluation signal pair corresponding to an input single pair to the first output terminal pair. The second latch latches the evaluation signal pair and outputs the evaluation signal pair to a second output terminal pair. The floating reduction unit is controlled by signals of the first output terminal pair and is operationally connected between current passing nodes of the first latch to prevent the first output terminal pair from floating. The input signal applying unit is disposed between the current passing nodes and a ground terminal, and receives the input signal pair. The ground switch is disposed between the input signal applying unit and the ground terminal, and is controlled by the clock signal. The delay reduction unit is disposed between the input signal applying unit and the ground switch, and reduces a signal delay from when the clock signal to when the evaluation signal pair is output from the second output terminal pair.

33 Claims, 23 Drawing Sheets

SENSE AMPLIFIER CIRCUIT AND SENSE AMPLIFIER-BASED FLIP-FLOP HAVING THE SAME

CROSS-REFERENCE TO RELATED APPLICATIONS

This application claims priority to Korean Patent Applications Nos. 10-2006-0038633, filed on Apr. 28, 2006, and 10-2006-0053305, filed on Jun. 14, 2006, the contents of which are incorporated herein by reference in their entirety.

BACKGROUND OF THE INVENTION

1. Technical Field

The present disclosure relates to semiconductor integrated circuits, and more particularly, to a sense amplifier and a sense amplifier-based flip-flop having the same.

2. Discussion of Related Art

Mobile devices, such as cellular telephones, personal digital assistants (PDAs) and notebook computers, have an increased power management expense based on an increasingly large capacity and increasing clock speeds. Very large scale integration (VLSI) systems benefit from lower power consumption by improving their circuit structure or logic.

The circuit structure in the VLSI system may be largely divided into two functions. One function is a logic function to send a required output signal in response to an input signal, and the other one is a memory function to store an input signal in response to a clock signal or to output a stored signal. In a block having the latter function, the most fundamental and central portion may be a flip-flop.

As one example of the flip-flop, a sense amplifier-based flip-flop may be provided. The sense amplifier-based flip flop may be generally classified as a master latch and a slave latch.

As the master latch, a sense amplifier circuit of the current sensing type is mainly used, and a setup time of the master latch is very small, approximate to '0'. As the slave latch, a NAND type SR latch is mainly used, in which a very stabilized operation may be obtained with high clock speeds.

The master latch employs a dynamic structure, thus obtaining high clock speeds as a benefit of the dynamic structure. The slave latch employs a static structure, thus obtaining a stabilized operation as a benefit of the static structure.

FIG. 1 is a circuit diagram of a conventional sense amplifier-based flip-flop.

Referring to FIG. 1, the sense amplifier-based flip-flop may include a master latch 2 and a slave latch 1.

The master latch 2 includes four PMOS transistors PM1, PM2, PM3 and PM4, and five NMOS transistor NM1, NM2, NM3, NM4 and NM5. The slave latch 1 may be implemented with a NAND type SR latch (not shown).

In the master latch 2, a PMOS transistor PM1 is connected between a power terminal VDD and a first output node N1, and operates in response to a clock signal CLK. The first output node N1 and a second output node N2, to be described below, may be output terminals of the master latch 2 and also input terminals of the slave latch 1.

The PMOS transistor PM2 and the NMOS transistor NM1 and NM3 are disposed between the power terminal VDD and a drain terminal of an NMOS transistor NM5 connected to a fifth node N5. The NMOS transistor NM5 operates in response to the clock signal CLK.

Gate terminals of the PMOS transistor PM2 and the NMOS transistor NM1 are connected in common the second output node, N2, and an input signal D is applied to a gate terminal of the NMOS transistor NM3.

The PMOS transistor PM4 is disposed between the power terminal VDD and the second output node N2, and operates in response to the clock signal CLK.

The PMOS transistor PM3 and the NMOS transistors NM2 and NM4 are connected between the power terminal VDD and a drain terminal of the NMOS transistor NM5 connected to the fifth node N5.

Gate terminals of the PMOS transistor PM3 and the NMOS transistor NM2 are connected to the first output node N1, and an inverted input signal /D is applied to a gate terminal of the NMOS transistor NM4.

A conventional sense amplifier-based flip-flop having the master latch 2 and the slave latch 1 connected to the master latch 2 may be called a sense amplifier D flip-flop, since the sense amplifier-based flip-flop operates as a D flip-flop to receive applied input and inverted input signals D and /D and output delayed output and inverted delayed output signals Q and /Q in response to the clock signal CLK.

When the clock signal CLK has a low logic level, the first and second output nodes N1 and N2 become a high logic level regardless of the logic levels of the input and inverted input signals D and /D. In other words, when the clock signal CLK has a low logic level, the first output node N1 becomes a high logic level by a turn-on operation of the PMOS transistor PM1, and the second output node N2 becomes a high logic level by a turn-on operation of the PMOS transistor PM4.

At this time, the input signals S and R have a high logic level, thus output signals Q and /Q of the slave latch 1 are kept with their previous values intact, that is, a precharge state.

When the clock signal CLK becomes a high logic level, a voltage of output nodes N1 and N2 is decided by a logic state of the input signal D.

For example, if the clock signal CLK has a high logic level, and the input signal D has a high logic level, an output node N1 becomes a low logic level, and an output node N2 becomes a high logic level.

Meanwhile, the clock signal CLK becomes a high logic level, and the input signal D has a low logic level, the output node N1 becomes a high logic level and the output node N2 becomes a low logic level.

That is, when the clock signal CLK has a low logic level, output nodes N1 and N2 are precharged, and when the clock signal CLK has a high logic level, logic levels of the output nodes N1 and N2 are decided by an input signal D. A period provided when the clock signal CLK has a high logic level, may an evaluation period, and the master latch 2 has an evaluation state at the evaluation period. At this time, output signals of the output nodes N1 and n2 may be called evaluation signals.

In the sense amplifier-based flip-flop, in case a logic level of the input signal D is changed while the clock signal CLK is maintained as a high logic level, concerns may arise.

Referring to the following <TABLE 1>, the concerns will be described.

TABLE 1

| CLK | D | /D | N1(S) | N2(R) | N3 | N4 |
|---|---|---|---|---|---|---|
| L | X | X | H | H | H | H |
| H | H | L | L | H | L | F |
| H | L | H | F | H | F | L |
| L | X | X | H | H | H | H |

L indicates a low logic level, H indicates a high logic level, X indicates 'don't care', and F designates a floating.

The <TABLE 1> is a summary for operation of the sense amplifier-based flip-flop shown in FIG. 1, and FIG. 2 is a timing diagram illustrating operation of the conventional sense amplifier-based flip-flop of FIG. 1.

As shown in <TABLE 1> and in FIG. 2, if an input signal D is changed when clock signal CLK has a high logic level, output node N1 and node N3 have a low logic level, but the low logic level of a floating state. In other words, and NMOS transistor NM3 is turned off, thus the node N3 becomes floating, and so the output node N1 also becomes floating. The floating designates that a logic level of the output node N1 and node N3 may be easily changed by an external factor. This designates a state of the output node N1 and node N3 at a period t2. That is, the drawing shows that at the period t2, output nodes N1 and N2, and nodes N3 and N4, have a specific logic level, but such logic level may be easily changed by an external factor.

Further, in <TABLE 1>, only the case that the input signal D is changed from a high logic level to a logic level, was shown, but in case the input signal D is changed from a low logic level to a high logic level, the remaining ones except the output node N1 that is changed to an output node N2 and the node N3 is changed to a node N4, are the same.

The floating state causes unstable operation of the circuit or data loss.

FIG. 3 is a circuit diagram of an improved conventional sense amplifier-based flip-flop of FIG. 1.

Referring to FIG. 3, a sense amplifier-based flip-flop has an NMOS transistor NM16 to reduce floating at output nodes N11 and N12. FIG. 4 is a timing diagram illustrating operation of the improved conventional sense amplifier-based flip-flop of FIG. 3.

In FIG. 3, the configuration is the same as in the conventional sense amplifier-based flip-flop of FIG. 1, except for the addition of an NMOS transistor NM16 between a node N13 and a node N14 in a master latch 12, thus a repeated description will be omitted.

In the master latch 12, the NMOS transistor NM16 connected between node N13 and node N14 includes a gate terminal to which power source voltage VDD is always applied, and drain and source terminals connected to node N13 and node N14. The NMOS transistor NM16 maintains always a turn-on state in a circuit of the master latch 12.

The NMOS transistor NM16 has a relatively small driving capability as compared with NMOS transistors NM11, NM12, NM13, NM14 and NM15, since the NMOS transistor NM16 is always turned on to prevent a floating of node N11, N12 and so the NMOS transistor NM16 influences the master latch 12, that is, influences an evaluation operation of sense amplifier. In order to reduce such influence, the NMOS transistor NM16 has a relatively small driving capability.

In the sense amplifier-based flip-flop shown in FIG. 3, even though input signal D is changed, for example, from a high logic level to a low logic level or from a low logic level to a high logic level, in a high logic state of the clock signal CLK; output node N11, N12 or node N13, N14 of the sense amplifier-based flip-flop may be prevented from floating by an additional installation of the NMOS transistor NM16.

With reference to FIGS. 3 and 4, logic level change of output nodes N11 and N12 or nodes N13 and N14 will be described as follows.

For example, if clock signal CLK has a low logic level, PMOS transistor PM11, PM14 is turned on, and so output node N11, N12 and node N13, N14 maintain a high logic levels regardless of input signal D, /D. At this time, NMOS transistor NM11, NM12 is turned on and PMOS transistor PM12, PM13 is turned off.

If the clock signal CLK is transited to a high logic level, the PMOS transistor PM11, PM14 is turned off, and NMOS transistor NM15 is turned on. Herein, if input signal D has a high logic level, output node N11 becomes a low logic level, and output node N12 maintains a high logic level intact (A11). Also, NMOS transistor NM16 is always turned on, thus node N14 falls corresponding to a logic level of node N13 (A15).

In other words, a current path is formed along node N14, NMOS transistor NM16, node N13, NMOS transistor NM13, node N15 and NMOS transistor NM15, and after a lapse of given time, a logic level of the node N14 becomes the same as a logic level of the node N13 (actually, a threshold voltage of NMOS transistor NM16 should be considered, but from only the viewpoint of high or low logic level, it may be regarded as the same logic level).

Even if a logic level of the input signal is changed, maintaining a high logic level of the clock signal CLK, a logic level of the node N13, N14 is not changed, because the NMOS transistor NM16 is always turned on. Thus, a floating effect of output node N11, N12 shown in FIG. 1 is prevented.

This may be also applied equally to a case that a logic level to turn on the NMOS transistor NM13 by the input signal D is higher than a logic level to turn on the NMOS transistor NM14 by the input signal /D, instead of the case that the input signal D and the input signal /D have opposite logic levels.

For example, if the NMOS transistor NM13 is turned on with a relatively higher voltage level, the nodes N13 and N11 become a low logic level, and the nodes N12 and N14 maintain a high logic level. In this state, even in a case where logic level of the input signal D becomes a logic level by turning off the NMOS transistor NM13, occurs (of course, it should be a state that the NMOS transistor NM14 was turned on by the input signal /D); the node N13 does not become floating as the NMOS transistor NM16 has a turn-on state. Thus, the node N11 may be prevented from floating.

However, as shown in timings g1 and g2 of N13 and N14 shown in FIG. 4, a voltage difference between nodes N13 and N14, changed after the clock signal CLK is transited to a high logic level and in response to that, may be reduced substantially. Thus, a voltage difference between nodes N11 and N12 is reduced and an input sensitivity falls.

The input sensitivity means a capability of sense amplifier to sense and amplify a small voltage level difference between two signals, which is generally needed between the two signals in order to perform a sense operation of the sense amplifier.

In other words, the NMOS transistor NM16 is employed in the sense amplifier-based flip-flop, thus in an evaluation of the NMOS transistor NM16, a voltage difference between node N13 and node N14 is reduced, and there is a concern due to substantially decreasing the input sensitivity of the sense amplifier, causing errors in the operation of the sense amplifier-based flip-flop.

Consequently, a sense amplifier-based flip-flop without a floating output node as an output terminal of a master latch and without a drop of input sensitivity is desired.

FIG. 5 is a circuit diagram of a conventional sense amplifier-based flip-flop.

With reference to FIG. 5, the sense amplifier-based flip-flop includes a first latch 52 and a second latch 50.

The first latch 52 includes PMOS transistors PM51, PM52, PM53, PM54, PM55 and PM56, and NMOS transistors NM51, NM52, NM53, NM54 and NM55. The second latch 50 may be a general NAND type SR latch (not shown in detail).

The first latch 52 has a similar structure to the first latch 2 shown in FIG. 1.

The PMOS transistors PM15 and PM16 added to the first latch 2 of FIG. 1 are operationally connected with nodes N53 and N54 through the clock signal CLK, and provide power source voltage VDD to the nodes N53 and N54. The clock signal CLK is applied to gate terminals of the PMOS transistors PM55 and PM56. For example, when the clock signal CLK has a low logic level, the PMOS transistors PM55 and PM56 are turned on and provide power source voltage VDD to the nodes N53 and N54. If the clock signal CLK has a high logic level, the PMOS transistors PM55 and PM56 are turned off.

Operation of the sense amplifier-based flip-flop is similar to that of the sense amplifier shown in FIG. 1. A difference exists in that a voltage drop of the nodes N53 and N54 is reduced by the PMOS transistors PM55 and PM56.

FIG. 6 is a timing diagram illustrating operation of the conventional sense amplifier-based flip-flop of FIG. 5.

FIG. 6 illustrates waveforms based on timing of clock signal CLK, input signals D, /D, output nodes N51, N52, N53 and N54, and output signals Q, /Q.

When the clock signal has a low logic level, the output nodes N51, N52, N53 and N54 all maintain a high logic level.

When the clock signal is transited to a high logic level, a logic level of the output node N51, N52, N53, N54 is changed in response to the transition.

The logic level change of the output node N51, N52, N53, N54 based on the clock signal CLK and the input signals D, /D was described in full above.

FIG. 6 illustrates a delay time Td1 as a time from a transition of clock signal CLK to an applied time of output signal Q, /Q.

However, the conventional sense amplifier-based flip-flop has a precharge state during a low logic level of the clock signal CLK, and performs sense and amplification operation only during a high logic level of the clock signal CLK, thus it is difficult to reduce the delay time Td1 to a given length or below.

That is, in the conventional sense amplifier-based flip-flop shown in FIG. 4, a processing speed decreases due to a long delay time and it is difficult to design next-connected circuits.

Therefore a sense amplifier-based flip-flop circuit having a short delay time is necessarily required.

A bus channel in a system employing a memory device having the sense amplifier-based flip-flop circuit has a low pass filter characteristic, signals applied to the memory device frequently generate an inter symbol interference (ISI), which causes, for example, loss of data and error in the operation of the memory device.

As described above and with reference to FIGS. 1 to 6, the conventional sense amplifier-based flip-flop circuit has concerns, such as a floating situation, a drop of input sensitivity, a long delay time form a clock signal to an output signal, and an ISI situation of an input signal. The concerns frequently produce data loss and operational errors.

Therefore, a sense amplifier-based flip-flop resolving the concerns is desired.

SUMMARY OF THE INVENTION

Accordingly, exemplary embodiments of the present invention provide a sense amplifier circuit and a sense amplifier-based flip-flop having the same, which is capable of improving floating of output terminals as an input terminal of a slave latch. Further, a stable operation can be provided with a relatively small loss of data. In addition, an input sensitivity drop of a sense amplifier can be improved.

Exemplary embodiments of the present invention provide a sense amplifier circuit and a sense amplifier-based flip-flop, capable of resolving a difficulty in reducing delay time, the difficulty caused according to a precharge state of a clock signal during a low logic level of the clock signal CLK and a sense and amplification operation performed only in a transition to a high logic level of the clock signal. The sense amplifier circuit and the sense amplifier-based flip-flop may improve a decreased processing speed caused by a long delay time of the conventional sense amplifier-based flip-flop and a difficulty in designing next-connected circuits. Further, data loss and operational errors may be substantially reduced by lessening an ISI effect.

According to exemplary embodiments of the present invention, a sense amplifier-based flip-flop operating in response to a clock signal includes a first latch configured to output a second logic level signal to a first output terminal pair regardless of an input signal pair when the clock signal has a first logic level, and to output an evaluation signal pair corresponding to the input signal pair to the first output terminal pair when the clock signal has a second logic level; a second latch configured to latch the evaluation signal pair and to output the evaluation signal pair to a second output terminal pair; and a floating reduction unit configured to be controlled by signals of the first output terminal pair and to be operationally connected between current passing nodes of the first latch so as to prevent the first output terminal pair from floating.

The first logic level may be a low logic level and the second logic level may be a high logic level.

The first latch may include a first node that becomes a high logic level when the clock signal has a low logic level and that has a first evaluation signal when the clock signal has a high logic level, and a second node that becomes a high logic level when the clock signal has a low logic level, and that has a second evaluation signal when the clock signal has a high logic level. The first and second nodes may be the first output terminal pair and the first and second evaluation signals may be the evaluation signal pair.

The floating preventing unit may be turned off when all of output signals of the first node and the second node have a high logic level, and may be turned on when any one of the output signals of the first and second nodes has a low logic level.

The floating preventing unit may include two NMOS transistors. In the two NMOS transistors, an inverted signal of the output signal of the first node is applied to a gate terminal of one NMOS transistor, and an inverted signal of the output signal of the second node is applied to a gate terminal of another NMOS transistor, and source and drain terminals thereof are in common connected with each other.

Further, the floating preventing unit may include two PMOS transistors. In the two NMOS transistors, the output signal of the first node is applied to a gate terminal of one PMOS transistor, and the output signal of the second node is applied to a gate terminal of another PMOS transistor, and source and drain terminals thereof are in common connected with each other.

The floating preventing unit may be a transmission gate controlled by an inverted signal of the output signal of the first node and the output signal of the second node.

The first latch mat include a first PMOS transistor, which is disposed between a power terminal and the first node and is turned on or off in response to the clock signal; a second PMOS transistor, which is disposed between the power terminal and the first node, and of which a gate terminal is connected to the second node; a first NMOS transistor, which is disposed between the first node and a third node, and of which a gate terminal is connected to the second node; a third PMOS transistor, which is disposed between the power terminal and the second node, and of which a gate terminal is connected to the first node; a fourth PMOS transistor disposed between the power terminal and the second node, and turned on or off in response to the clock signal; a second NMOS transistor, which is disposed between the second node and a fourth node, and of which a gate terminal is connected to the first node; a third NMOS transistor disposed between the third node and a fifth node, and controlled by a first input signal as one of the input signal pair; a fourth NMOS transistor disposed between the fourth node and the fifth node and controlled by a second input signal as another of the input signal pair; and a fifth NMOS transistor disposed between the fifth node and a ground terminal and turned on or off in response to the clock signal.

The third and fourth nodes may be the current passing nodes of the first latch.

The floating reduction unit may be operationally connected between the third node and the fourth node.

According to exemplary embodiments of the present invention, a sense amplifier circuit to operate in response to a clock signal and to sense and amplify an input signal pair and generate a corresponding output signal pair, includes one pair of precharge enable switches to enable voltage of first and second nodes to become a second logic level when the clock signal has a first logic level, one of the precharge enable switches being disposed between a power terminal and the first node, and another thereof being disposed between the power terminal and the second node; a latch including a first inverter having the first node as an output terminal and the second node as an input terminal, and a second inverter having the first node as an input terminal and the second node as an output terminal; a floating preventing unit controlled by output signals of the first and second nodes and operationally connected between current passing nodes of the latch so as to prevent the first or second node from floating; an input signal applying unit disposed between the current passing nodes of the latch and a ground terminal, to individually receive the input signal pairs; and a ground switch disposed between the input signal applying unit and the ground terminal, and controlled and turned on/off by the clock signal.

The current passing nodes may be third node as one end of a first NMOS transistor constituting the first inverter, and a fourth node as one end of a second NMOS transistor constituting the second inverter.

The floating preventing unit may be turned off when all of output signals of the first and second nodes have a high logic level, and may be turned on when any one of output signals of the first and second nodes has a low logic level.

The input signal applying unit may include a first input transistor disposed between the first current passing node and the ground switch, to receive a first input signal as one of the input signal pair; and a second input transistor disposed between the second current passing node and the ground switch, to receive a second input signal as one of the input signal pair.

According to exemplary embodiments of the present invention, a sense amplifier-based flip-flop operating in response to a clock signal includes a first latch for outputting a second logic level signal to a first output terminal pair when the clock signal has a first logic level, and outputting an evaluation signal pair corresponding to an input signal pair to the first output terminal pair when the clock signal has a second logic level; a second latch configured to latch the evaluation signal pair and to output the evaluation signal pair to a second output terminal pair; and a delay reduction unit connected to a current passing node of the first latch, for reducing a signal delay time of from a transition point of time when the clock signal is transited from a first logic level to a second logic level, to a point of time when the evaluation signal pair is output from the second output terminal pair.

The first latch may include a first PMOS transistor disposed between a power terminal and the first node and turned on or off in response to the clock signal; a second PMOS transistor disposed between the power terminal and the first node, a gate terminal of the second PMOS transistor being connected to the second node; a first NMOS transistor disposed between the first node and a third node, a gate terminal of the first NMOS transistor being connected to the second node; a third PMOS transistor disposed between the power terminal and the second node, a gate terminal of the third PMOS transistor being connected to the first node; a fourth PMOS transistor disposed between the power terminal and the second node, and turned on or off in response to the clock signal; a second NMOS transistor disposed between the second node and a fourth node, a gate terminal of the second NMOS transistor being connected to the first node; a third NMOS transistor disposed between the third node and a fifth node as a current passing node, and controlled by a first input signal as one of the input signal pair; a fourth NMOS transistor disposed between the fourth node and the fifth node, and controlled by a second input signal as another of the input signal pair; a fifth PMOS transistor operationally connected to the third node through the clock signal, to provide power source voltage to the third node; a sixth PMOS transistor operationally connected to the fourth node through the clock signal, to provide the power source voltage to the fourth node; and a fifth NMOS transistor disposed between the fifth node and a ground terminal, and turned on or off in response to the clock signal.

The delay reduction unit may enable the third and fourth nodes to have different logic levels when the clock signal has a low logic level.

The delay reduction unit may be always turned on by an applied bias voltage, so as to pass current from the third or fourth node to a ground terminal. The bias voltage may be power source voltage.

According to exemplary embodiments of the present invention, a sense amplifier circuit operating in response to a clock signal, for sensing and amplifying an input signal pair when the clock signal has a high logic level, to generate its corresponding output signal pair, includes one pair of precharge enable switches operating to enable voltage of first and second nodes to become a high logic level when the clock signal has a low logic level, one of the precharge enable switches being disposed between a power terminal and the first node, and another thereof being disposed between the power terminal and the second node; a latch constructed of a first inverter having the first node as an output terminal and the second node as an input terminal, and a second inverter having the first node as an input terminal and the second node as an output terminal; a voltage variation preventing unit for stabilizing voltage of current passing nodes of the latch when the clock signal has a low logic level; an input signal applying unit coupled with the current passing nodes of the latch, for receiving the input signal pair; a ground switch connected to the input signal applying unit and turned on or off in response to the clock signal so as to pass current of the input signal applying unit to a ground terminal; and a delay reduction unit connected to the input signal applying unit, for enabling the current passing nodes to have different logic levels when the clock signal has a low logic level.

The delay reduction unit may be at least one NMOS transistor whose gate terminal is supplied with the bias voltage, whose drain terminal is connected to the input signal applying unit, and whose source terminal is connected to a ground terminal.

According to exemplary embodiments of the present invention, a sense amplifier-based flip-flop operating in response to a clock signal includes a first latch for outputting a second logic level signal to a first output terminal pair when the clock signal has a first logic level, and outputting an evaluation signal pair corresponding to an input signal pair to the first output terminal pair when the clock signal has a second logic level; a second latch configured to latch the evaluation signal pair and to output the evaluation signal pair to a second output terminal pair; a delay reduction unit connected with current passing nodes of the first latch, for reducing a signal delay time of from a transition point of time when the clock signal is transited from a first logic level to a second logic level, to a point of time when the evaluation signal pair is output from the second output terminal pair; and a high pass filter connected between the current passing nodes of the first latch, so as to prevent a degradation of output characteristic based on frequency even in a high frequency of the input signal pair.

The first latch may include a first PMOS transistor disposed between a power terminal and the first node, and turned on or off in response to the clock signal; a second PMOS transistor disposed between the power terminal and the first node, a gate terminal of the second PMOS transistor being connected to the second node; a first NMOS transistor disposed between the first node and a third node, a gate terminal of the first NMOS transistor being connected to the second node; a third PMOS transistor disposed between the power terminal and the second node, a gate terminal of the third PMOS transistor being connected to the first node; a fourth PMOS transistor disposed between the power terminal and the second node, and turned on or off in response to the clock signal; a second NMOS transistor disposed between the second node and a fourth node, a gate terminal of the second NMOS transistor being connected to the first node; a third NMOS transistor disposed between the third node and a fifth node, and controlled by a first input signal as one of the input signal pair; a fourth NMOS transistor disposed between the fourth node and a sixth node, and controlled by a second input signal as another of the input signal pair; a fifth PMOS transistor operationally connected to the third node through the clock signal, to provide power source voltage to the third node; a sixth PMOS transistor operationally connected to the fourth node through the clock signal, to provide the power source voltage to the fourth node; and current passing transistors disposed between the fifth node and the ground terminal and between the sixth node and the ground terminal, and turned on or off in response to the clock signal.

The delay reduction unit may be always turned on by an applied bias voltage, thus current from the third and fourth node is passed to a ground terminal so as to enable the third and fourth nodes to have different signal logic levels when the clock signal has a low logic level.

The high pass filter may include a resistor and a capacitor connected in parallel between the fifth node and the sixth node.

According to exemplary embodiments of the present invention, a sense amplifier-based flip-flop operating in response to a clock signal includes a first latch for outputting a second logic level signal to a first output terminal pair when the clock signal has a first logic level, and outputting an evaluation signal pair corresponding to an input signal pair to the first output terminal pair when the clock signal has a second logic level; a second latch configured to latch the evaluation signal pair and to output the evaluation signal pair to a second output terminal pair; a floating preventing unit controlled by signals of the first output terminal pair and so operationally connected between current passing nodes of the first latch so as to prevent the first output terminal pair from floating; an input signal applying unit disposed between the current passing nodes of the first latch and the ground terminal, for each receiving the input signal pair; a ground switch disposed between the input signal applying unit and the ground terminal, and turned on or off by the clock signal; and a delay reduction unit disposed between the input signal applying unit and the ground switch, for reducing a signal delay time of from a transition point of time when the clock signal is transited from a first logic level to a second logic level, to a point of time when the evaluation signal pair is output from the second output terminal pair.

The sense amplifier-based flip-flop may further include a high pass filter connected between the current passing nodes of the input signal applying unit, which is capable of prevent a degradation of output characteristic based on frequency even if frequency of the input signal pair is high.

BRIEF DESCRIPTION OF THE DRAWINGS

Exemplary embodiments of the present invention can be understood in more detail from the following descriptions taken in conjunction with the attached drawings in which.

DETAILED DESCRIPTION OF EXEMPLARY EMBODIMENTS

Figure 1:
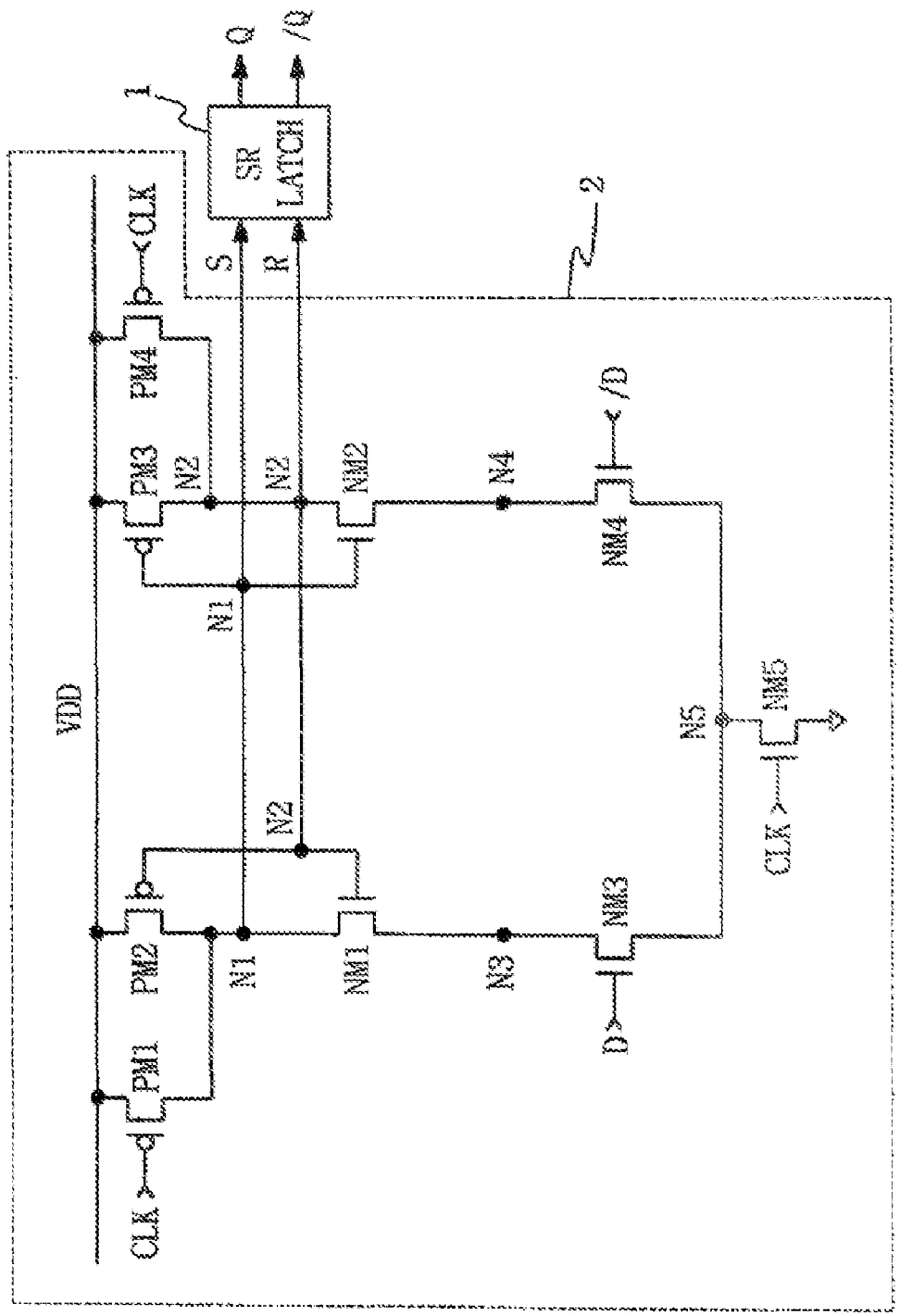
FIG. 1 is a circuit diagram of a conventional sense amplifier-based flip-flop.
Figure 2:
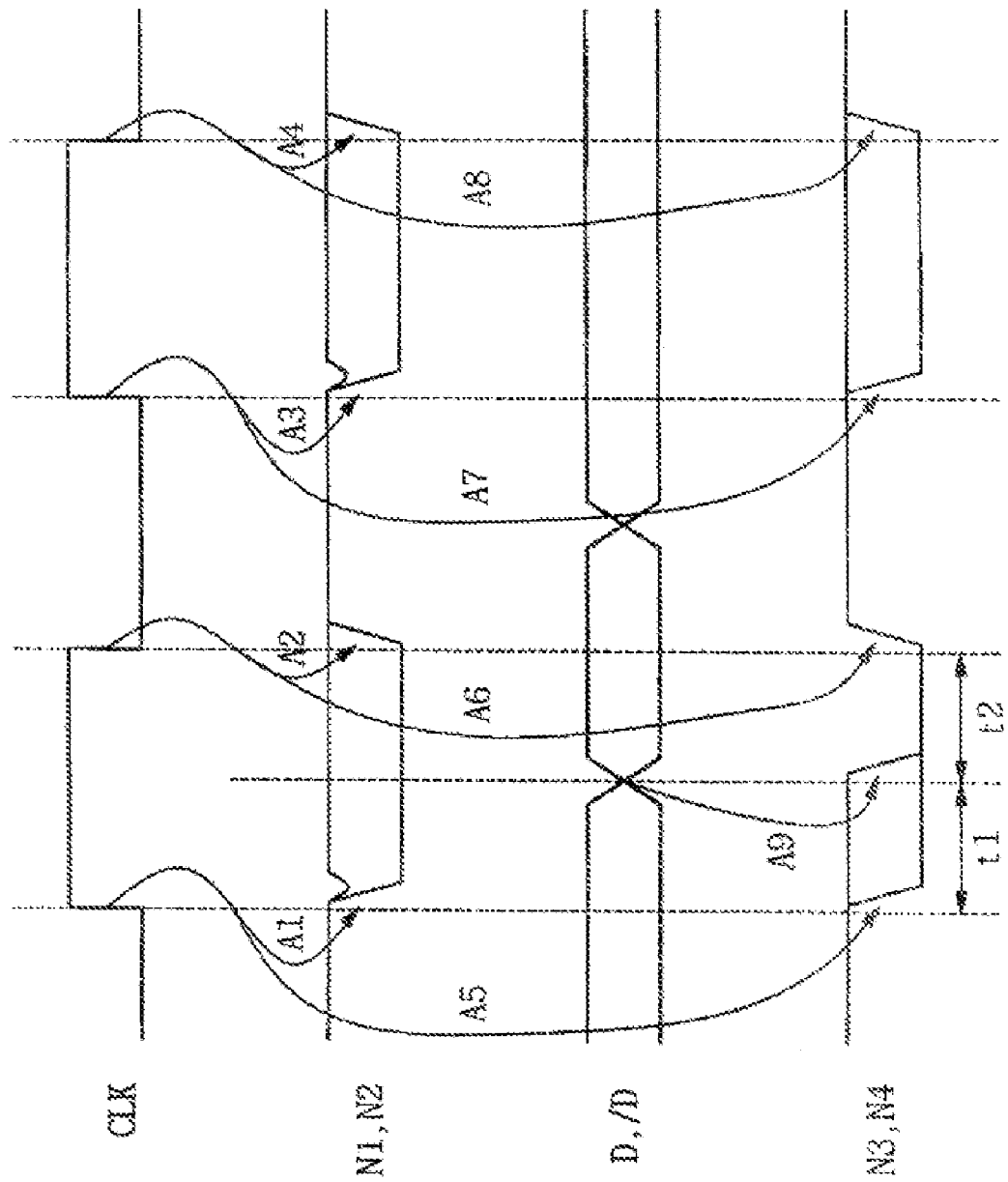
FIG. 2 is a timing diagram illustrating operation of the conventional sense amplifier-based flip-flop of FIG. 1.

The present invention will now be described more fully with reference to the accompanying drawings, in which exemplary embodiments of the invention are shown. This invention may, however, be embodied in may different forms and should not be construed as limited to the exemplary embodiments set forth herein. Like reference numerals denote like elements in the drawings.

Figure 7:
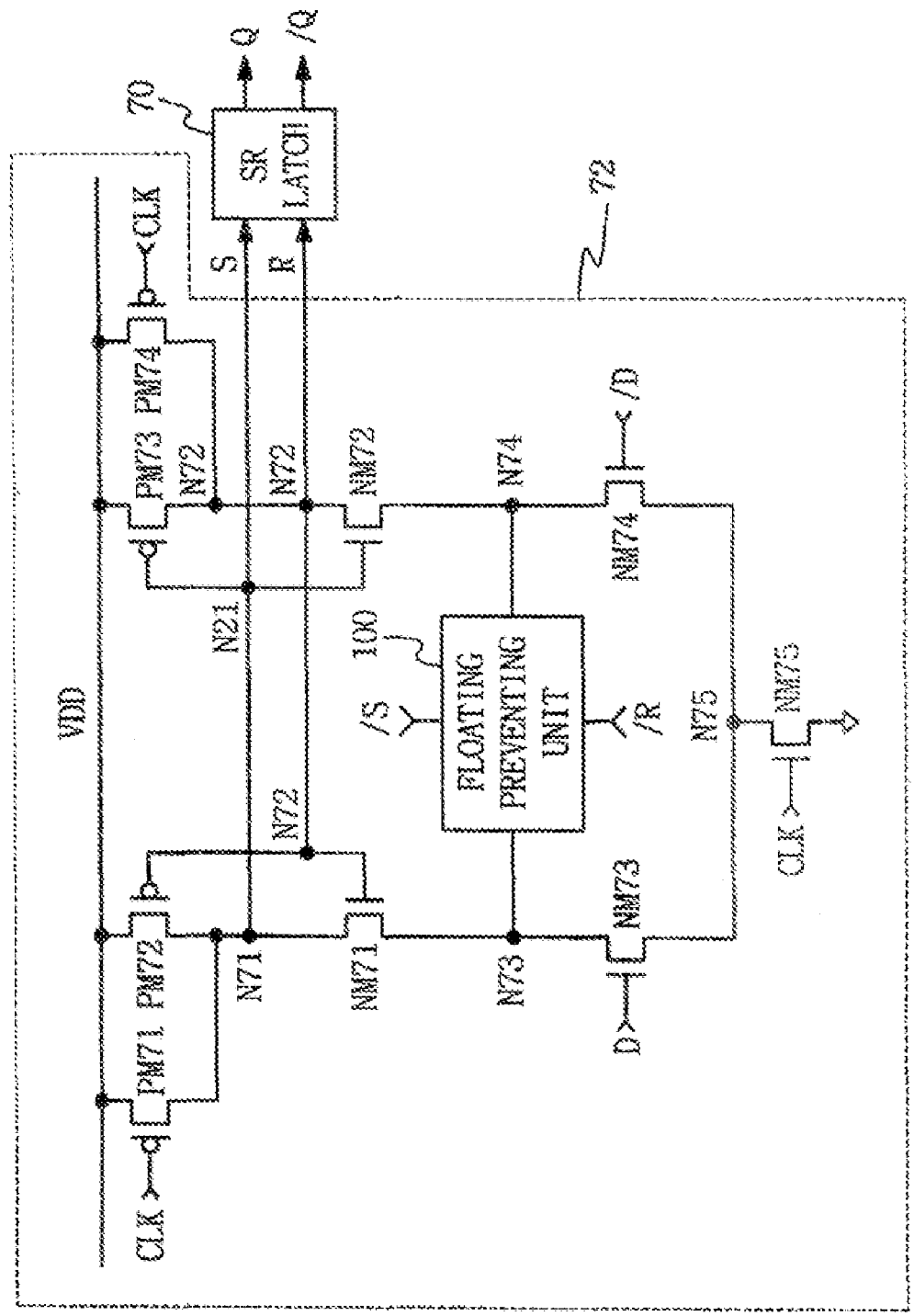
FIG. 7 is a circuit diagram of a sense amplifier-based flip-flop according to an exemplary embodiment of the present invention.
Figure 8:
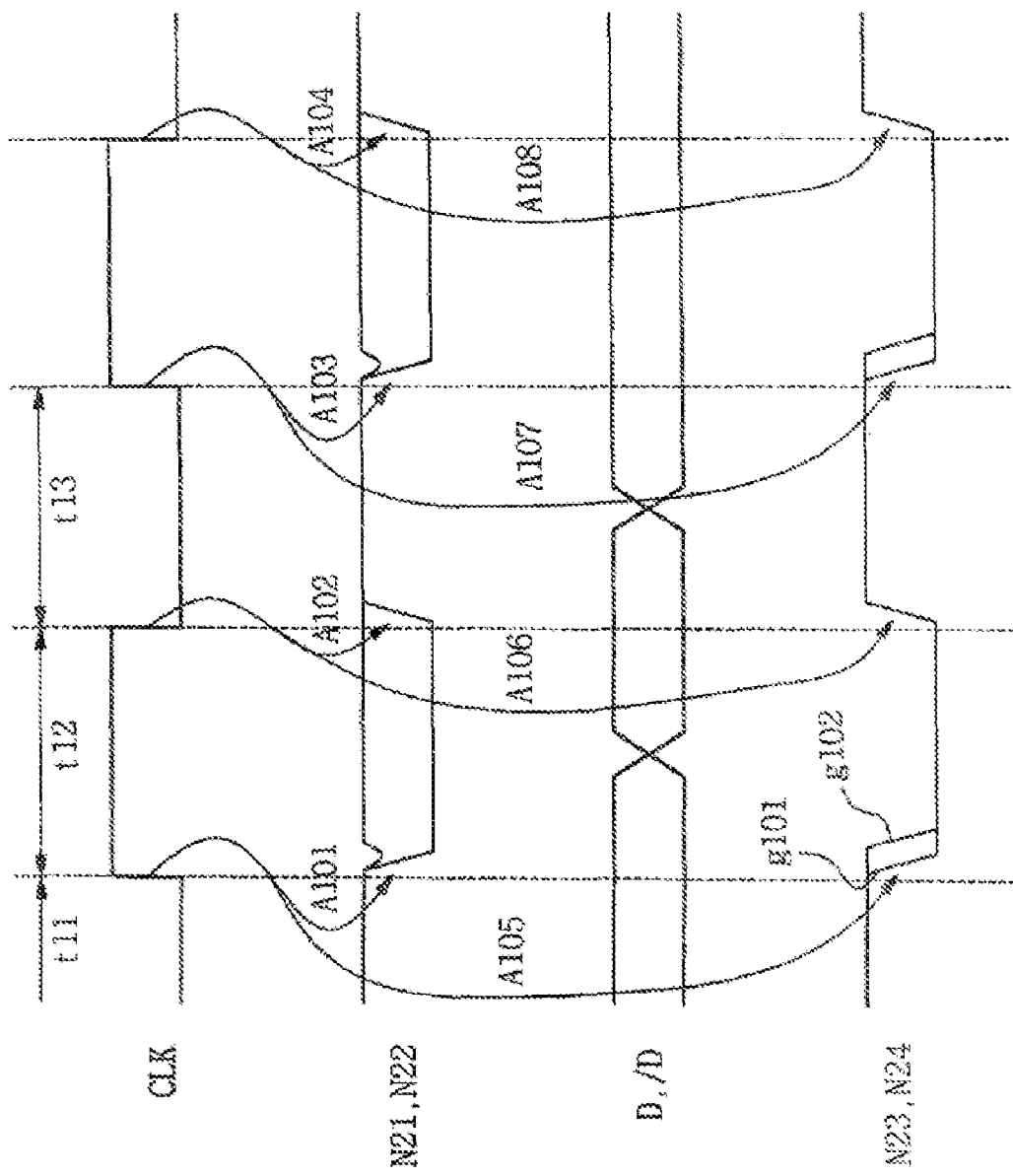
FIG. 8 is a timing diagram illustrating operation of the sense amplifier-based flip-flop of FIG. 7.

FIG. 7 is a circuit diagram of a sense amplifier-based flip-flop according to an exemplary embodiment of the present invention, and FIG. 8 is a timing diagram illustrating operation of the sense amplifier-based flip-flop of FIG. 7.

With reference to FIG. 7, the sense amplifier-based flip-flop operating in response to a clock signal CLK includes a first latch 72, a second latch 70 and a floating preventing unit 100 to prevent a floating of the output node.

The first latch 72 may include a first PMOS transistor PM71 disposed between a power terminal VDD and a first node N71, to be turned on or off in response to clock signal CLK, a second PMOS transistor PM72 disposed between the power terminal VDD and the first node N71, a gate terminal of the second PMOS transistor PM72 being connected to the second node N72, and a first NMOS transistor NM71 disposed between the first node N71 and a third node N73, a gate terminal of the first NMOS transistor NM71 being connected to the second node N72.

Further, the first latch 72 may include a third PMOS transistor PM73 disposed between the power terminal VDD and the second node N72, a gate terminal of the third PMOS transistor PM73 being connected to the first node N71, a fourth PMOS transistor PM74 disposed between the power terminal VDD and the second node N72, to be turned on or off in response to the clock signal CLK, and a second NMOS transistor NM72 disposed between the second node N72 and a fourth node N74, a gate terminal of the second NMOS transistor NM72 being connected to the first node N71.

The first latch 72 may include a third NMOS transistor NM73 disposed between the third node N73 and fifth node N75, and controlled by an input signal D, and a fourth NMOS transistor NM74 that is connected between the fourth node N74 and the fifth node N75 and is controlled in response to an inverted signal of the input signal D.

Further, the first latch 72 may include a fifth NMOS transistor NM75 disposed between the fifth node N75 and a ground terminal and turned on or off in response to the clock signal CLK.

The first node N71 and the second node N72 may be a first output terminal pair S, R. The first output terminal pair s, R may be an output terminal pair of the first latch 72 and simultaneously an input terminal pair of the second latch 70. If the clock signal CLK has a first logic level, the first latch 72 outputs a second logic level signal to the first output terminal pair S, R regardless of a logic level of input signal pair D, /D. If the clock signal CLK has a second logic level, the first latch 72 outputs an evaluation signal pair corresponding to the input signal to the first output terminal pair S, R.

The first logic level may be low logic level and the second logic level may be a high logic level.

An example of the case that the first logic level is a low logic level and the second logic level is a high logic level, will be herein described as follows.

The second latch 70 latches the evaluation signal pair and outputs the evaluation signal pair to a second output terminal pair Q, /Q. The second latch 70 may have an SR latch. The SR latch may be called an RS flip-flop, and an example therefore is provided in FIG. 11, and will be described below with reference to FIG. 11.

Figure 9:
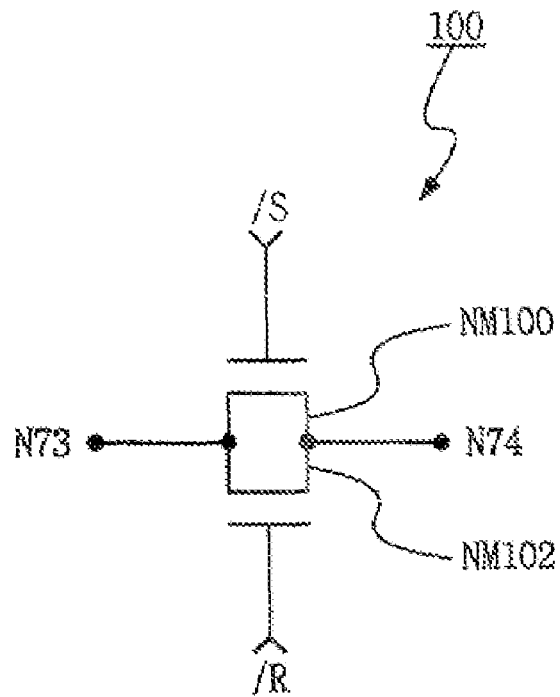
FIG. 9 is a circuit diagram of a floating reduction unit of FIG. 7 according to an exemplary embodiment of the present invention.
Figure 10:
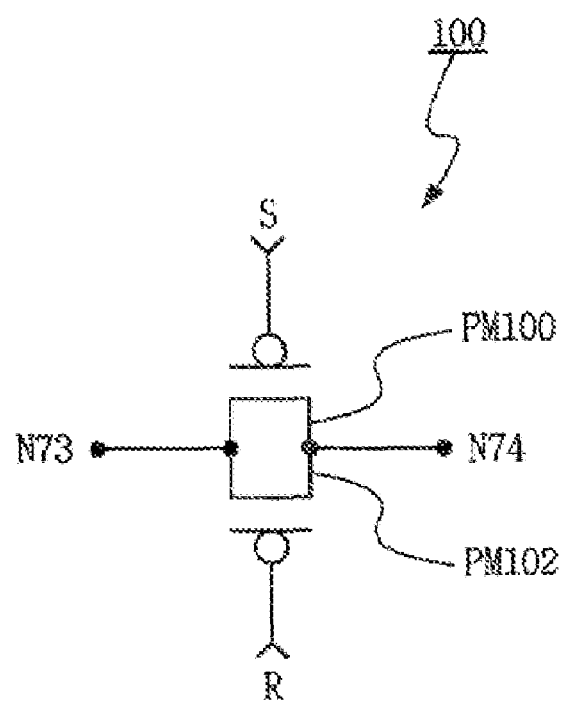
FIG. 10 is a circuit diagram of a floating reduction unit of FIG. 7 according to an exemplary embodiment of the present invention.

The floating preventing unit 100 is operationally connected between current passing nodes of the first latch 72. The current passing nodes may be third node N73 and fourth node N74. The floating prevention unit 100 is turned off when all of the output signals of the first node N71 and the second node N72 have a high logic level, and is turned on when any one of the output signals of the first node N71 and the second node N72 has a low logic level. Thus, the third node N73 or the fourth node N74 is prevented from floating, and so the first node N71 or the second node N72 as the first output terminal pair S, R is prevented from floating. Detailed examples of the floating preventing unit 100 are shown in FIGS. 9 and 10, and the floating preventing unit 100 will be below described more in detail with reference to FIGS. 9 and 10.

Detailed operation of a sense amplifier-based flip-flop including the first latch 72, the second latch 70 and the floating preventing unit 100 will be described with reference to FIGS, 7 and 8, as follows.

When the clock signal CLK has a low logic level at a period t11, first PMOS transistor PM71 and fourth PMOS transistor PM74 are turned on, and first node N71 and second node N72 become a high logic level. Also, second PMOS transistor PM72 and third PMOS transistor PM73 are turned off, and first NMOS transistor NM71 and second NMOS transistor NM72 are turned on. Third node N73 and fourth node N74 maintain a high logic level since fifth NMOS transistor NM75 is turned off. Also, the floating preventing unit 100 has a turn-off state since all of output signals S and R of the first node N71 and the second node N72 have a high logic level. At this time, the sense amplifier-based flip-flop can be regarded as a precharge state.

When the clock signal CLK is transited to a high logic level at a period t12, the first node N71 has a logic level corresponding to the input signal D in response to the clock signal CLK (A101), and the second node N72 has a logic level opposite to a logic level of the first node N71. The logic level corresponding to the input signal D does not indicate the same logic level as a logic level of the input signal D, but indicates an evaluation signal based on a logic level of the input signal D.

For example, when the input signal D has a high logic level, third NMOS transistor NM73 is turned on, and fourth NMOS transistor NM74 is turned off. Then, the first node N71 becomes a low logic level, and the second node N72 becomes a high logic level. ON the contrary, when the input signal D has a low logic level, the third NMOS transistor NM73 is turned off, and the fourth NMOS transistor NM74 is turned on, thus the first node N71 becomes a high logic level, and the second node N72 becomes a low logic level.

Meanwhile, the input signal pair D, /D may have a logic level to provide different turn-on voltage levels of the third NMOS transistor NM73 and the fourth NMOS transistor NM74, instead of a logic level to discriminate a high logic level from a low logic level. For example, if the input signal D has a voltage level higher than the input signal /D, the third NMOS transistor NM73 is turned on with a logic level higher than that of the fourth NMOS transistor NM74, and consequently, the first node N71 becomes a low logic level, and the second node N72 becomes a low logic level. the case in which the input signal pair D, /D is regarded as having complementary logic levels, and its opposite case, may have a little difference as described above, but final logic levels of the first node N71 and the second node N72 have the same results consequently, thus the input signal pair D, /D will be described as having complimentary logic levels, as follows.

Then, at a period t12, third node N73 and fourth node N74 provide waveforms g101 and g102 shown in the drawing in response to the clock signal CLK. For example, when the clock signal CLK is transited to a high logic level and an input signal D has a high logic level, the third node N73 gradually falls to a low logic level (g101). The floating preventing unit 100 is turned on, and fourth node N74 also gradually falls to a low logic level (g102). That is, according as the floating preventing unit 100 is turned on, a path along fourth node N74, third node N73, fifth node N74 and the ground terminal is generated. At this time, even though the input signal D is transited to a low logic level, a floating of node N1 based on a floating of node N3, like a floating caused in a conventional sense amplifier-based flip-flop shown in FIG. 1, does not occur.

Figure 4:
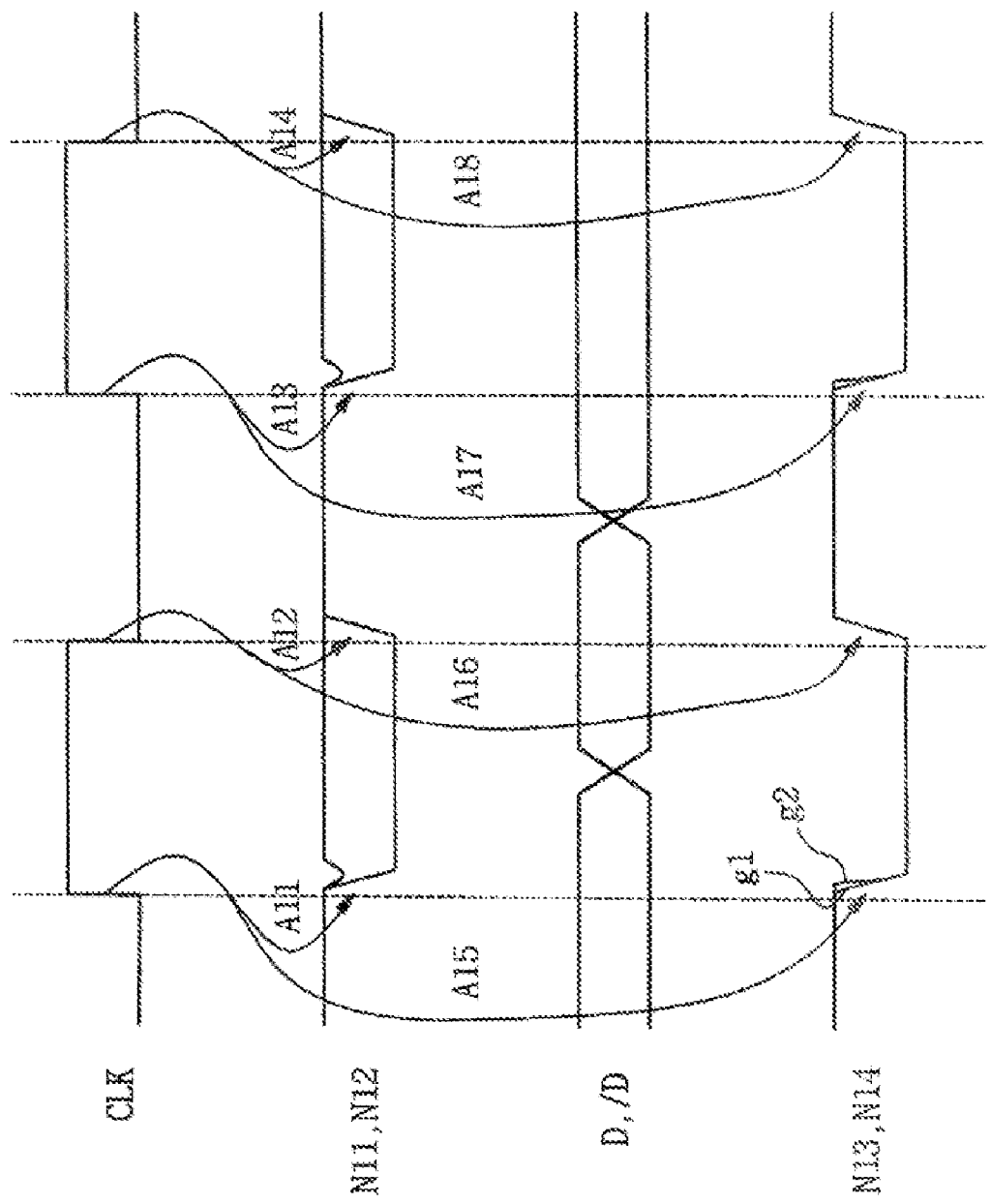
FIG. 4 is a timing diagram illustrating operation of the improved conventional sense amplifier-based flip-flop of FIG. 3.

In addition, the floating preventing unit 100 according to some embodiments of the invention may improve a fall of input sensitivity shown in the timing of N13 and N14 in FIG. 4. In comparing g1 and g2 of FIG. 4 with g101 and g102 of FIG. 8 it can be known that the difference is remarkable. In other words, a signal voltage level difference between nodes N73 and N74 closely relates to a sense amplifier, an input sensitivity of first latch 72, thus g1 and g2 of FIG. 4 hardly have a signal voltage level difference and the input sensitivity decreases, causing error in operation of the sense amplifier. However, according to exemplary embodiments of the present invention, an operation characteristic like in g101 and g102 of FIG. 8 does not cause a drop in the input sensitivity.

When the clock signal CLK is also transited to a low logic level at a period t13, fifth NMOS transistor NM75 is turned off, and first PMOS transistor PM71 and fourth PMOS transistor PM74 are turned on, and the first node N71 and second node N72 become a high logic level.

FIG. 9 is a circuit diagram of a floating preventing unit 100 of FIG. 7 according to an exemplary embodiment of the present invention.

Referring to FIGS. 7 and 9, the floating preventing unit 100 includes two NMOS transistors NM100 and NM102.

An inverted signal /S of the output signal of first node N71 is applied to a gate terminal of one NMOS transistor NM100,
and an inverted signal /R of the output signal of second node is applied to a gate terminal of another NMOS transistor NM102, and source and drain terminals of two NMOS transistors NM100 and NM102 are connected in common with each other. Two NMOS transistors NM100 and NM102 are disposed between third node N73 and fourth node N74.

For example, when clock signal CLK has a low logic level, in other words, an output signal S of first node N71 and an output signal R of second node have a high logic level, the NMOS transistor NM100 and NM102 are turned off. This, third node N73 and fourth node N74 are disconnected.

If the clock signal CLK is transited to a high logic level, any one of the NMOS transistors NM100 and NM102 is turned on, and the third node N73 and the fourth node N74 are connected. In this state, in case a logic level of input signal D is changed, the third node N73 and the fourth node N74 are prevented from floating, and first node N71 or second node N72 as output terminal of the first latch 72 and simultaneously the input terminal of the second latch 70, is prevented from floating.

Figure 3:
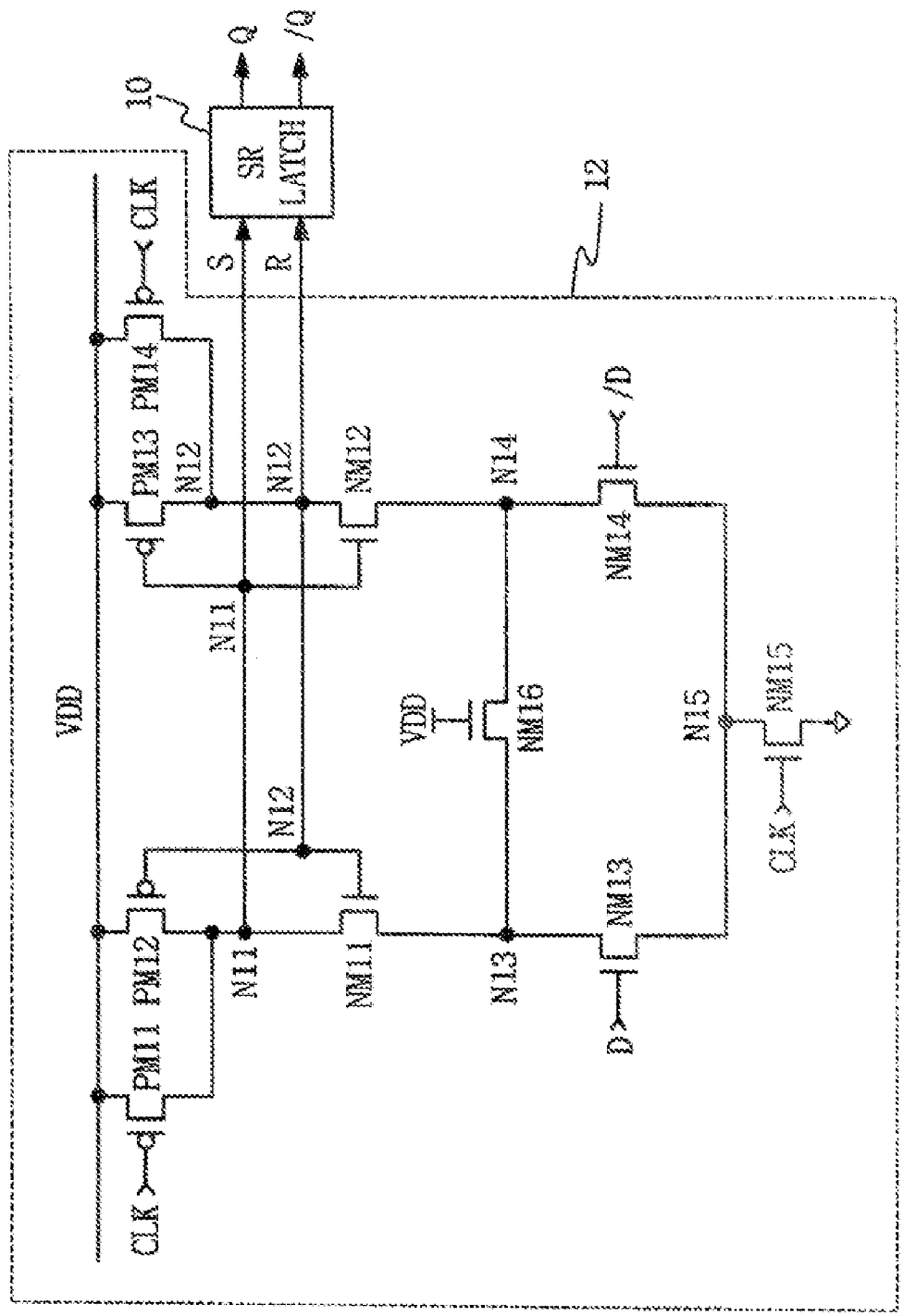
FIG. 3 is a circuit diagram of an improved conventional sense amplifier-based flip-flop of FIG. 1.

On the contrary to the case that NMOS transistor NM16 of FIG. 3 is connected between nodes N13 and N14 of FIG. 3 and is always turned on in a conventional sense amplifier-based flip-flop shown in FIG. 3; according to exemplary embodiments of present the invention, the NMOS transistor is turned off when output signals of first node N71 and second node N72 as an output terminal pair of first latch 72 have a high logic level, the input sensitivity may be improved, reducing a loss of data caused by error in operation of the sense amplifier-based flip-flop.

FIG. 10 is a circuit diagram of a floating preventing unit of FIG. 7 according to an exemplary embodiment of the present invention.

With reference to FIG. 10, the floating preventing unit 100 includes two PMOS transistors PM100 and PM102.

An output signal S of the first node N71 is applied to a gate terminal of one PMOS transistor PM100, and an output signal R of the second node N72 is applied to a gate terminal of another PMOS transistor PM102, and source and drain terminals of two PMOS transistors PM100 and PM102 are in common connected with each other, and are connected with third node N73 and fourth node N74.

In the floating preventing unit 100 shown in FIG. 10, and in comparison with the floating preventing unit 100 shown in FIG. 7, except that control signals S, R and /S, /R have an inverted relation and transistors are different as the PMOS transistor PM100, PM102 from the NMOS transistor NM100, NM102, operations are equal and thus a detailed description therefore will be omitted.

Though not shown in the drawing, the floating preventing unit 100 may be a transmission gate controlled by an inverted signal of output signal of the first node N71 and an output signal of the second node N72. In other words, the transmission gate is a general CMOS transmission gate, and may be constructed of one NMOS transistor and one PMOS transistor.

As shown in FIGS. 9 and 10, the floating preventing unit 100 is controlled by output signals of first node N71 and second node N72, and is operationally connected between third node N73 and fourth node N74, thereby an output terminal of first latch 72 may be prevented from floating and an input sensitivity may be improved.

Figure 11:
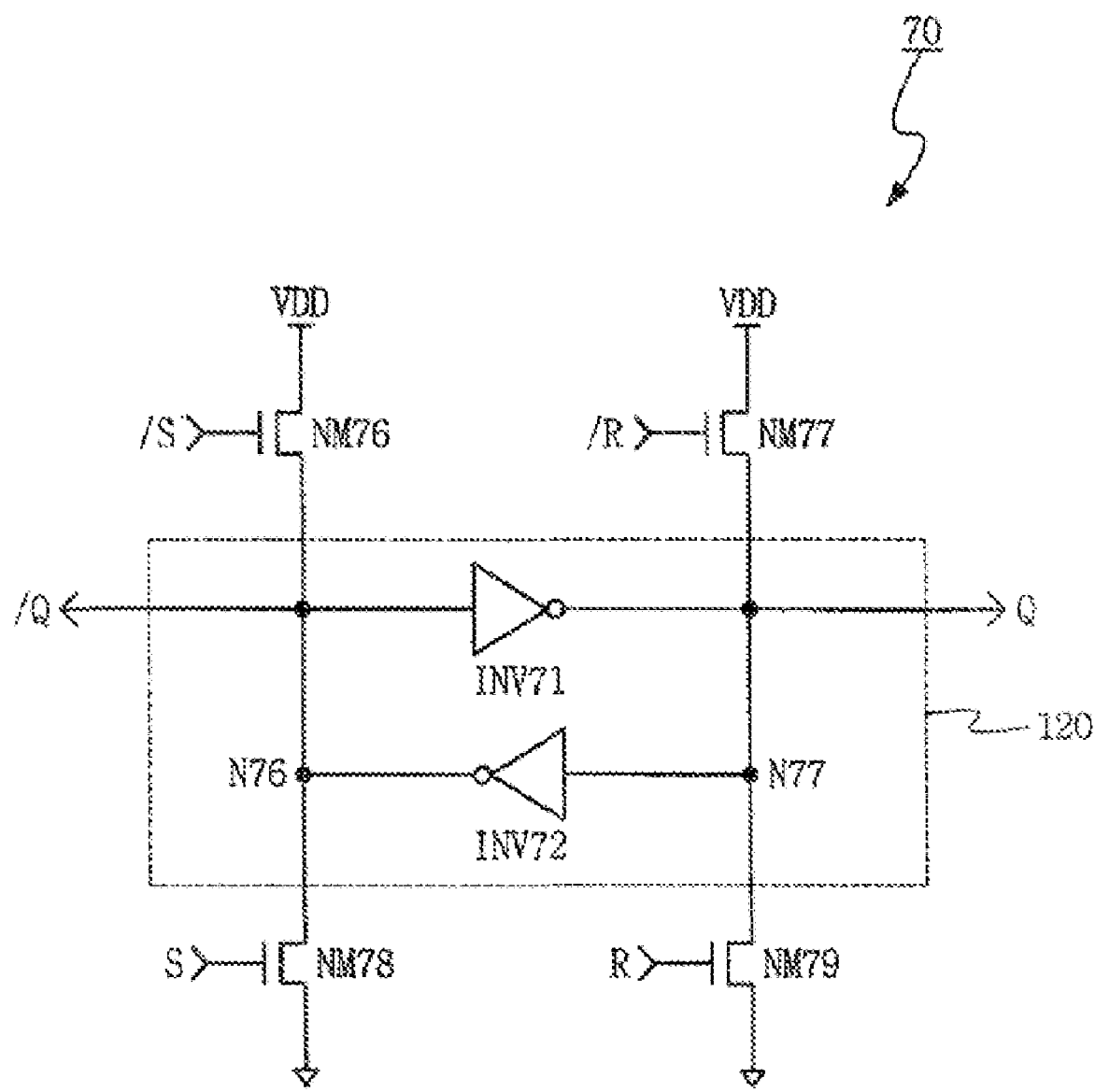
FIG. 11 is a circuit diagram of a second latch of FIG. 7.

FIG. 11 is a circuit diagram of a second latch of FIG. 7.

Referring to FIG. 11, SR latch of the second latch 70 includes a latch 120 constructed of two inverters INV71 and INV72, and NMOS transistors NM78, NM79, NM76 and NM77 that are controlled and operate by signals S and R output from the output of first latch (22 of FIG. 7) and their inverted signals /S and /R.

For example, when a logic set of output signal S, R of the first latch (22 of FIG. 7) becomes a high/low logic level or low/high logic level, the second latch 70 outputs an output signal pair corresponding to the output signals S, R of the first latch to the output terminal pair Q, /Q. A case that a logic set of the output signal S, R has a low/low logic level is not defined. When a logic set of the output signal S, R has a high/high logic level, the sense amplifier-based flip-flop of FIG. 7 has a precharge state.

Figure 12:
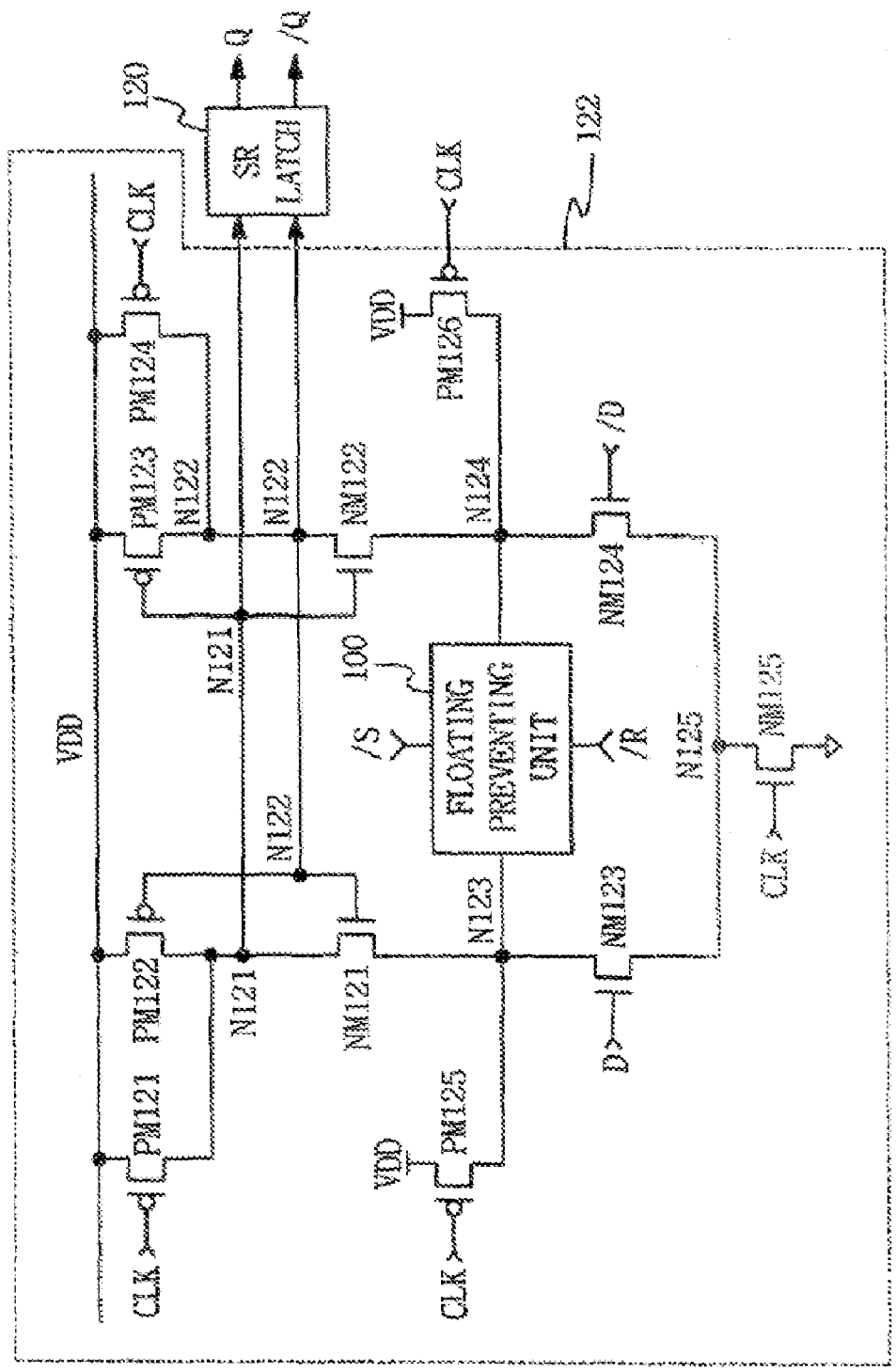
FIG. 12 is a circuit diagram of a sense amplifier-based flip-flop according to an exemplary embodiment of the present invention.

FIG. 12 is a circuit diagram of a sense amplifier-based flip-flop according to an exemplary embodiment of the present invention.

Referring to FIG. 12, the sense amplifier-based flip-flop includes a first latch 122, a second latch 120 and a floating preventing unit 100. The configuration and operation of the second latch 120 and the floating preventing unit 100 are the same as FIG. 7, and the configuration and operation of the first latch 122 are the same as FIG. 7 except the configuration of voltage variation preventing units PM125 and PM126, thus the description except the voltage variation preventing unit PM125, PM126 will be omitted.

The sense amplifier-based flip-flop has the configuration of the voltage variation preventing units PM125 and PM126 added to the sense amplifier-based flip-flop shown in FIG. 7. The voltage variation preventing units PM125 and PM126 are each connected to a third node N123 and a fourth node N124 of the first latch 122 constituting the sense amplifier-based flip-flop, to prevent a voltage variation of the third node N123 and the fourth node N124, in particular, preventing a voltage drop.

The voltage variation preventing unit may include fifth PMOS transistor PM125 and PMOS transistor PM126.

When clock signal CLK has a low logic level, the fifth PMOS transistor PM125 and the sixth PMOS transistor PM126 are turned on in order to prevent an effect that voltage of the third node N123 and the fourth node N124 is lowered to a threshold voltage by NMOS transistors NM31, NM32.

When the clock signal CLK is transited to a low logic level, all of the fifth PMOS transistor PM125 and the PMOS transistor PM126 are turned off. Thus, the fifth PMOS transistor PM125 and the sixth PMOS transistor PM126 do not influence upon a signal logic level of the third and fourth nodes N123 and N124.

The senses amplifier-based flip-flop to improve a floating effect and an input sensitivity according to exemplary embodiments of the present invention was described above, and a sense amplifier circuit constituting the sense amplifier-based flip-flop will be described as follows.

With reference to FIG. 7, the first latch 72 of the sense amplifier-based flip-flop may be a current sense amplifier. In the above-mentioned description, the first latch 72 and the floating preventing unit 100 were described as separate elements, but the first latch 72 and the floating preventing unit 100 will be described as one sense amplifier circuit in the following description.

That is, according to exemplary embodiments of the present invention, a sense amplifier to sense and amplify an input signal and to generate its corresponding output signal may include one pair of precharge enable switches PM71, PM74, a latch PM72, PM73, NM71, NM72, a floating preventing unit 100, an input signal applying unit NM73, NM74, and a ground switch NM75.

The precharge enable switch may include two PMOS transistors PM71 and PM74. One PMOS transistor PM71 is connected a power terminal VDD and a first node N71, and another PMOS transistor PM74 is connected between the power terminal VDD and a second node N72, thus when the clock signal CLK has a low logic level, voltage of the first node N71 and the second node N72 becomes a high logic level.

The latch PM72, PM73 NM71, NM72 may be constructed of two inverters. A first inverter having PMOS transistor PM72 and NMOS transistor NM71 may have the first node N71 as an output terminal and the second node N72 as an input terminal. A second inverter having PMOS transistor PM73 and NMOS transistor NM72 has the first node N71 as an input terminal and the second node N72 as an output terminal.

The floating preventing unit 100 is controlled by an output signal of the first node N71 and an output signal of the second node N72 and is turned on or off, thus operationally connects a third node N73 as one end of NMOS transistor NM71 of the first inverter and a fourth node N74 as one end of NMOS transistor NM72 of the second inverter. When clock signal CLK has a low logic level, the floating preventing unit 100 is turned off, and when the clock signal CLK has a high logic level, the floating preventing unit 100 is turned on. As shown in FIG. 9, the floating preventing unit 100 may include two NMOS transistors. In other words, an inverted signal /S of output signal of the first node N71 is applied to a gate terminal of one NMOS transistor NM100, and an inverted signal /R of the output signal of the second node N72 is applied to a gate terminal of another NMOS transistor NM102, and source and drain terminals thereof are connected in common with each other. Further, as shown in FIG. 10, the floating preventing unit 100 may include two PMOS transistors. In other words an output signal S of the first node N71 is applied to a gate terminal of one PMOS transistor PM100, and an output signal R of the second node N72 is applied to a gate terminal of another PMOS transistor PM102, and source and drain terminals thereof are in common connected with each other.

The input signal applying unit NM73, NM74 may include an input transistor NM73 that is connected between the third node N73 and a fifth node N75, to receive a first input signal D, and an input transistor NM74 that is connected between the fourth node N74 and the fifth node N75, to receive a second input signal /D.

For example, when the clock signal CLK has a high logic level and a voltage level of the first input signal D is higher than a voltage level of the second input signal /D, the input transistor NM73 is turned on with a voltage level higher than that of the input transistor NM74. Then, the third node N73 and the first node N71 become a low logic level, and the second node N72 remains as a high logic level. At this time, the floating preventing unit 100 has a turn-on state.

Then, even if logic level of the first input signal D is changed to a low logic level and the input transistor NM73 is turned off (in this case, the second input signal /D has a voltage level sufficient to turn on the in input transistor NM74), the third node N73 does not float since the floating preventing unit 100 has a turn-on state. Thus, the first node N71 does not float.

The ground switch NM75 is connected between the fifth node N75 and a ground terminal, and is controlled and is turned on or off by the clock signal CLK. The ground switch NM75 is turned on when the clock signal CLK has a high logic level, and is turned off when the clock signal CLK has a low logic level.

Furthermore, as shown in FIG. 12, the sense amplifier circuit may further include a voltage variation preventing unit PM125, PM126 to stabilize voltage of nodes N123 and N124 when the clock signal CLK has a low logic level.

The operation of the sense amplifier circuit was described above in the description of first latch 72, 73 and the floating preventing unit 100 with reference to FIGS. 7 to 12, thus a repeated description is omitted.

Figure 13:
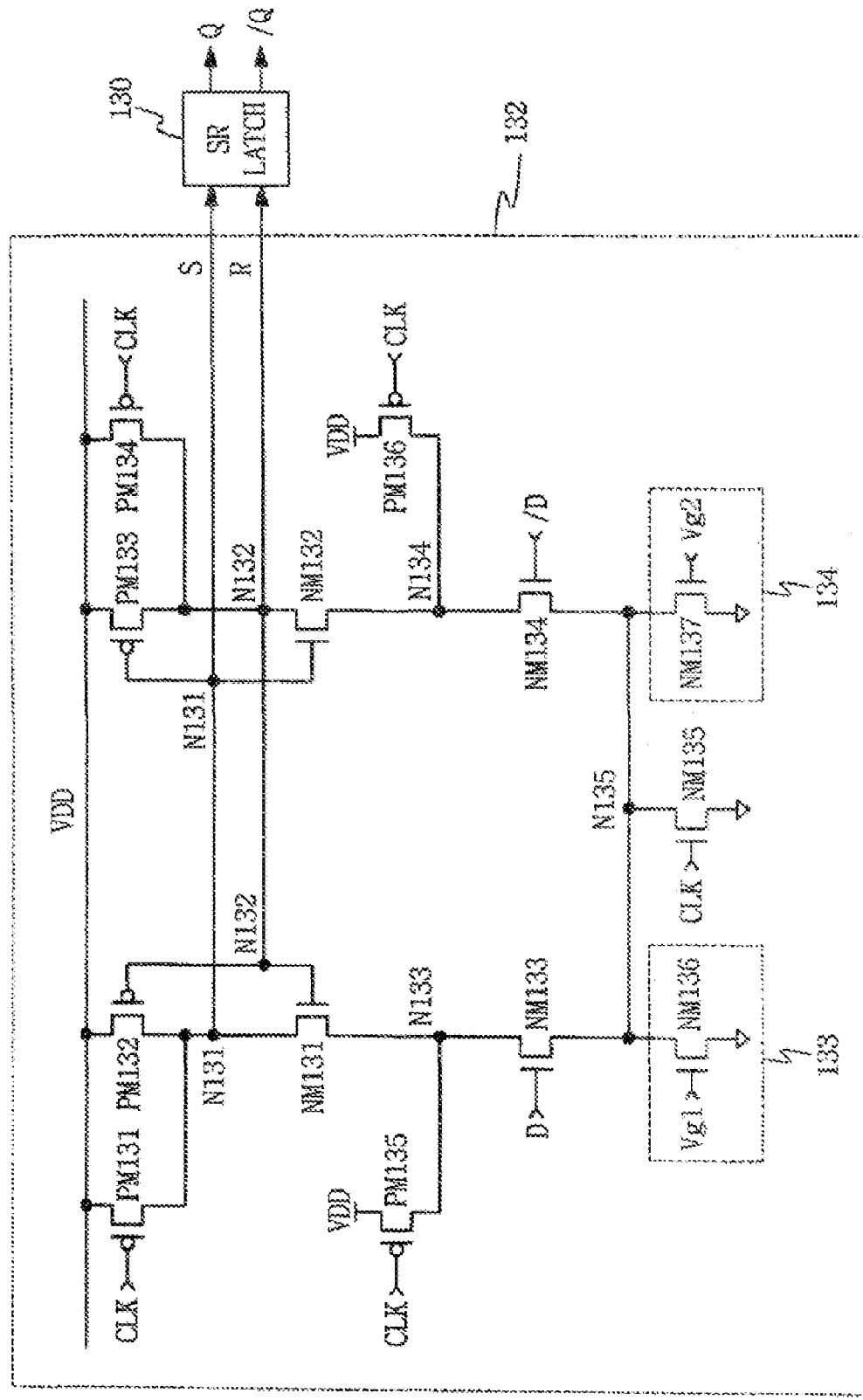
FIG. 13 is a circuit diagram of a sense amplifier-based flip-flop according to an exemplary embodiment of the present invention.
Figure 14:
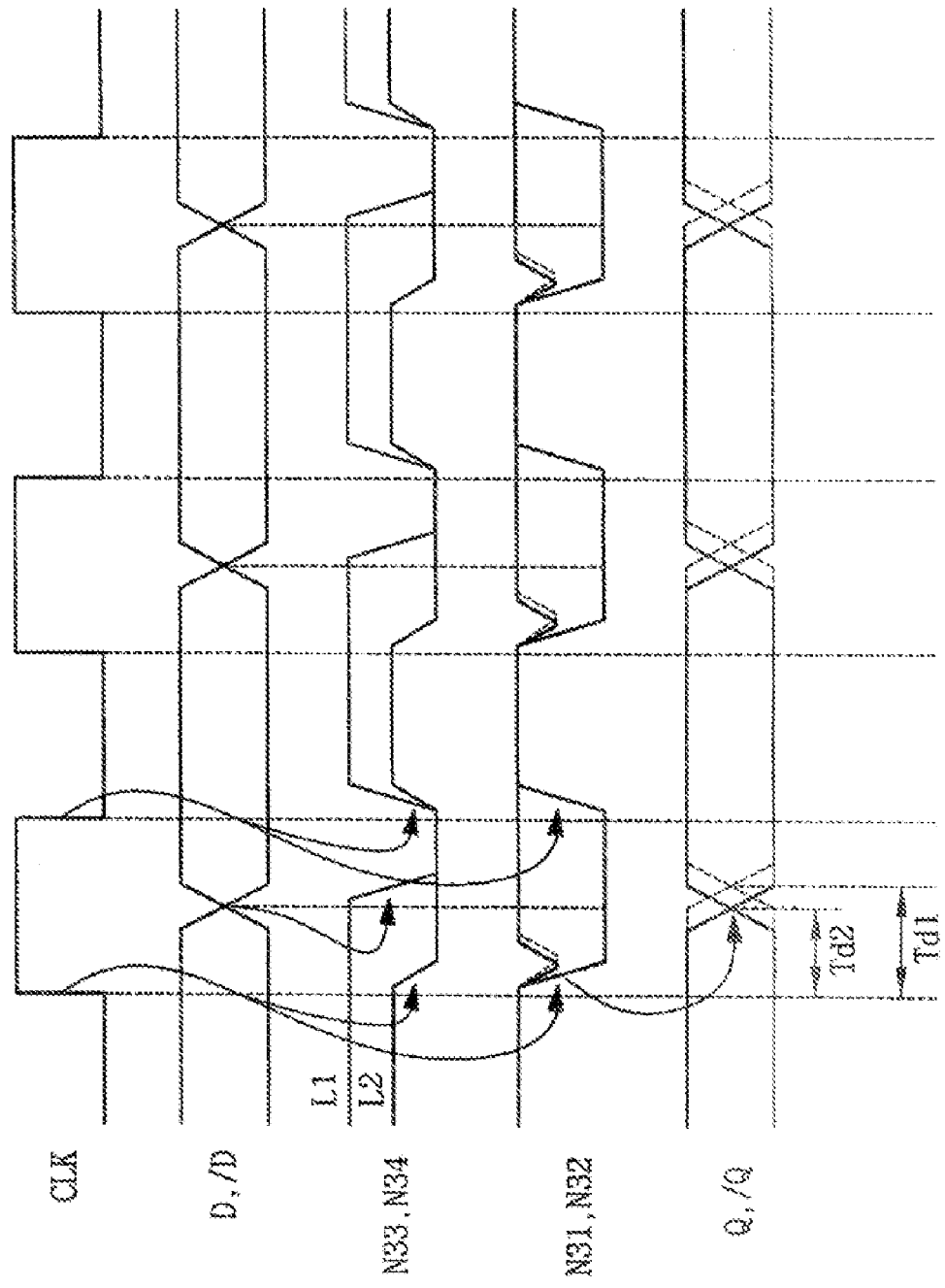
FIG. 14 is a timing diagram illustrating operation of the sense amplifier-based flip-flop of FIG. 13.

FIG. 13 is a circuit diagram of a sense amplifier-based flip-flop according to an exemplary embodiment of the present invention, and FIG. 14 is a timing diagram illustrating operation of the sense amplifier-based flip-flop of FIG. 13.

Referring first to FIG. 13, a sense amplifier-based flip-flop operating in response to a clock signal includes a first latch 132, a second latch 130, and delay reduction units 133, 134.

The first latch 132 may include a first PMOS transistor PM131, which is disposed between a power terminal VDD and a first node N131, and is turned on or off in response to the clock signal CLK; a second PMOS transistor PM132, which is disposed between the power terminal VDD and the first node N131, and of which a gate terminal is connected to a second node N132; and a first NMOS transistor NM131, which is disposed between the first node N131 and a third node N133, and of which a gate terminal is connected to the second node N132.

Further, the first latch 132 may include a third PMOS transistor PM133, which is disposed between the power terminal VDD and the second node N132, and of which a gate terminal is connected to the first node N131; a fourth PMOS transistor PM134 disposed between the power terminal VDD and the second node N132, and turned on or off in response to the clock signal CLK; and a second NMOS transistor nm 132, which is disposed between the second node N132 and a fourth node N134, and of which a gate terminal is connected to the first node N131;

Further, the first latch 132 may include a third NMOS transistor NM133 disposed between the third node N133 and a fifth node N135, and controlled by a first input signal D as one of the input signal pair D, /D; and a fourth NMOS transistor NM134 disposed between the fourth node N134 and the fifth node N135 and controlled be a second input signal /D as another of the input signal pair D, /D.

Furthermore, the first latch 132 may include a fifth PMOS transistor PM135 operationally connected to the third node N133 through the clock signal CLK, to provide power source voltage VDD to the third node N133; and a sixth PMOS transistor PM136 operationally connected to the fourth node N134 through the clock signal CLK, to provide the power source voltage VDD to the fourth node N134. The clock signal CLK is applied to gate terminals of the fifth and sixth PMOS transistors PM135 and PM136. For example, when the clock signal CLK has a low logic level, the fifth PMOS transistor PM135 and the sixth PMOS transistor PM136 are turned on, to provide power source voltage VDD to the third and fourth nodes N133 and N134. If the clock signal CLK has a high logic level, the fifth and sixth PMOS transistors PM135 and PM136 are turned off.

The first latch 132 may also include a fifth NMOS transistor NM135 disposed between the fifth node N135 and a ground terminal, and turned on or off in response to the clock signal CLK. The fifth NMOS transistor NM135 is turned on when the clock signal CLK has a high logic level, and is turned off when having a low logic level. The fifth node N135 may a current passing node of the first latch 132.

The first node N131 and the second node N132 may become a first output terminal pair S, R. The first output terminal pair S, R may be an output terminal pair of the first latch 132 and simultaneously an input terminal pair of the second latch 130. Thus, the first latch 132 outputs a second logic level signal to the first output terminal pair S, R when the clock signal CLK has a first logic level, and outputs an evaluation signal pair corresponding to the input signal pair D, /D to the first output terminal pair S, R when the clock signal CLK has a second logic level.

The first logic level may a low logic level and the second logic level may be a high logic level. For example, the first logic level as a low logic level and the second logic level as a high logic level will be described as follows.

In the first latch 132, the first node N131 becomes a high logic level when the clock signal CLK has a low logic level, and has a first evaluation signal as one of the evaluation signal pair when the clock signal CLK has a high logic level. The second node N132 becomes a high logic level when the clock signal CLK has a low logic level, and has a second evaluation signal as one of the evaluation signal pair when the clock signal CLK has a high logic level.

The second latch 130 latches the evaluation signal pair and outputs the evaluation signal pair to a second output terminal pair Q, /Q. The second latch 130 may include an SR latch. The SR latch may called an RS flip-flop, and its example is shown in FIG. 11.

The delay reduction unit 133, 134 is connected to a current passing node N135 of the first latch 132, and reduces a signal delay time of from a transition point of time when the clock signal CLK is transited from a low logic level to a high logic level, to a point of time when the evaluation signal pair is output from the second output terminal pair Q, /Q.

The delay reduction units 133, 134 may have at least one NMOS transistor NM136, NM137 whose gate terminal is supplied with an bias voltage Vg1, Vg2, whose drain terminal is connected to the fifth node N135, and whose source terminal is connected to a ground terminal.

Thus, the delay reduction units 133, 134 may be always turned on by an applied bias voltage Vg1, Vg2, so as to pass current from the third or fourth node N133 or N134 to a ground terminal. The delay reduction unit 133, 134 may enable the third and fourth nodes N133 and N134 to have differen logic levels when the clock signal CLK has a low logic level, thereby reducing a signal delay time of from a transition point of time when the clock signal CLK is transited from a low logic level to a high logic level, to a point of time when the evaluation signal pair is output from the second output terminal pair Q, /Q.

The bias voltage Vg1, Vg2 may be satisfied with voltage enough to turn on the NMOS transistor NM136, NM137. Thus, the bias voltage Vg1, Vg2 may be power source voltage VDD.

Referring subsequently to FIG. 14, it illustrates a logic level change of first to fourth nodes N131~N134(FIG. 13) in response to a transition of the clock signal CLK.

With reference to FIGS. 13 and 14, in assuming that an input signal D has a high logic level and an input signal /D has a low logic level, when an input signal pair D, /D is applied and the clock signal CLK is preserved as a low logic level, the first node N131 and the second node N132 maintain a high logic level. At this time, the NMOS transistor NM133 has a turn-on state, and the NMOS transistor NM134 has a turn-off state, thus generating a current path between the third node N133 and the fifth node N135. Also, current of the third node N133 is passed to ground terminal by the delay reduction unit 133, 134. A voltage level L2 of the third node N133 is maintained as a level lower than a voltage level L1 of fourth node N134 not having a current passing path. At this time, the first and second nodes N131 and N132 maintain a high logic level.

Figure 5:
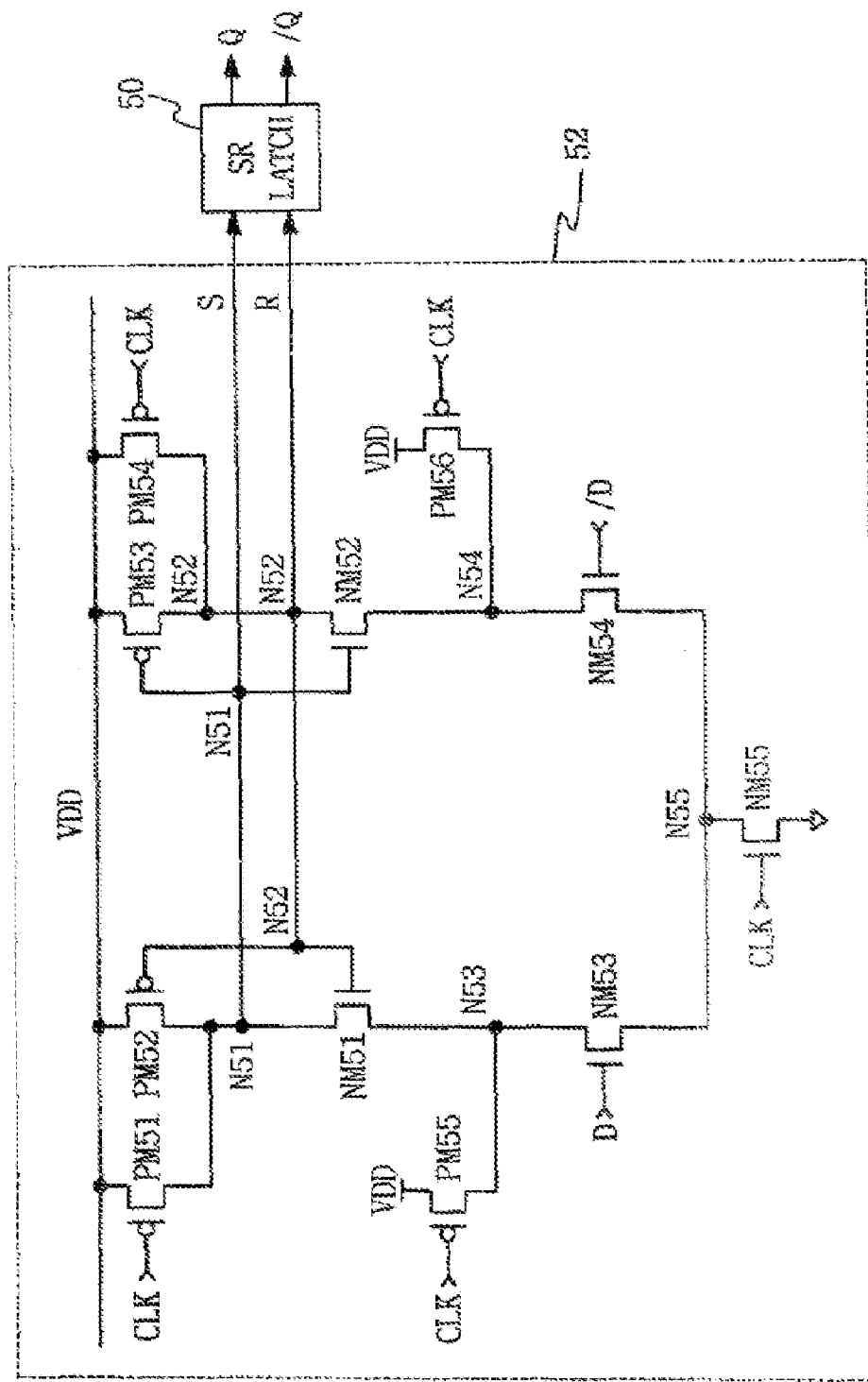
FIG. 5 is a circuit diagram of a conventional sense amplifier-based flip-flop.
Figure 6:
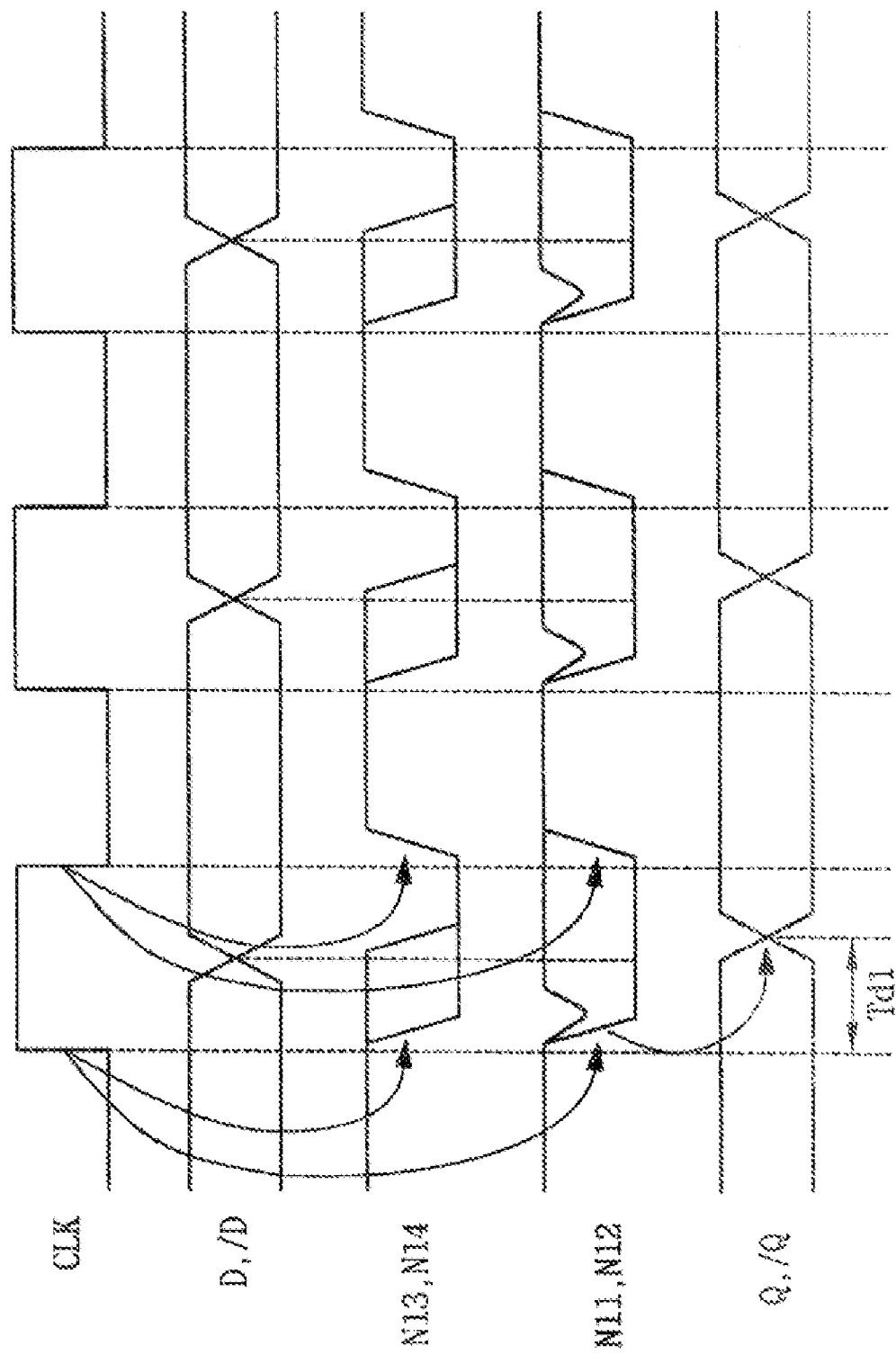
FIG. 6 is a timing diagram illustrating operation of the conventional sense amplifier-based flip-flop of FIG. 5.

In the sense amplifier-based flip-flop according to exemplary embodiments of the present invention, voltage levels of third and fourth nodes N133 and N134 have a difference in a precharge period the clock signal CLK maintains a low logic level, contrary to the conventional sense amplifier-based flip-flop shown in FIGS. 5 and 6.

When in this state, the clock signal CLK is transited from a low logic level to a high logic level, the third node N133 is transited to a low logic level. The first NMOS transistor NM131 has a turn-on state, thus the first node N131 is also transited to a low logic level.

The fourth node N134 maintains a high logic level, and then is transited to a low logic level when a logic level of input signal /D is changed. The second node N132 has a logic level variation immediately after the clock signal LCK is transited from a low logic level to a high logic level, and then restores to the high logic level.

That is, a signal of first output terminal N131, N132 is applied to second latch 130, then is output to second output to second output terminal pair Q, /Q.

As shown in a timing diagram of the second output terminal pair Q, /Q of FIG. 14, it can be known that a delay Td2 of from a clock signal to an output according to exemplary embodiments of the present invention is shorter than a delay Td1 of from clock signal to output according to a conventional art. This is why the third node N133 and the fourth node N134 previously have a logic level difference through the delay reduction unit 133, 134 in a period as a precharge period the clock signal CLK has a low logic level.

On the other hand, the input signal pair D, /D does not have a logic level for a discrimination between a high logic level and a low logic level, but may have a voltage level to enable the third NMOS and fourth NMOS transistors NM133 and NM134 to have differential turn-on voltage levels. For example, when an input signal D has a voltage level higher than an input signal /D, the third NMOS transistor NM133 is turned on more strongly than the fourth NMOS transistor NM134, consequently, the first node N131 becomes a low logic level and the second node N132 becomes a high logic level.

Though there is a little difference as described above, the result is equal consequently, thus the description will be provided as follows, by regarding the input signal pair D, /D as a complementary logic pair, which will be equally applied to an embodiment of FIG. 17.

A design target in a sense amplifier-based flip-flop generally is to (1) reduce a delay of from a clock signal to an output signal, (2) guarantee an input sensitivity, (3) provide operation without hysteresis and (4) substantially reduce uncertainty window, etc.

From such four target viewpoints in a sense amplifier-based flip-flop according to exemplary embodiments of the present invention, the design target of (1) for the delay reduction of from clock signal CLK to output signal Q, /Q was described above referring to FIG. 4. The targets of (2) to (4) will be described referring to FIGS. 5 and 16 whether they can be satisfied, as follows.

Figure 15:
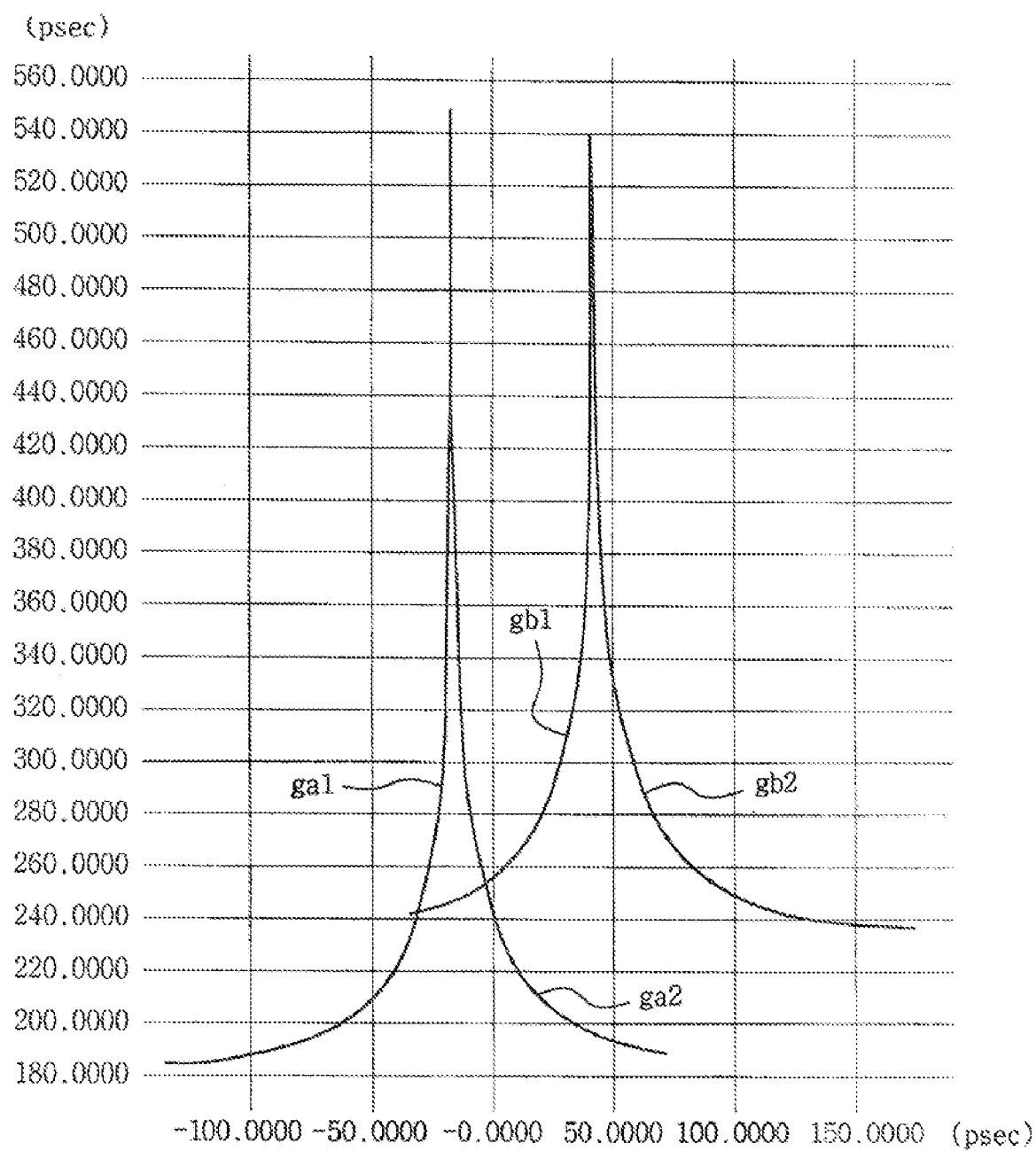
FIG. 15 is a graph comparing setup/hold windows of conventional sense amplifier-based flip-flops and sense amplifier-based flip-flop according to an exemplary embodiment of the present invention.
Figure 16:
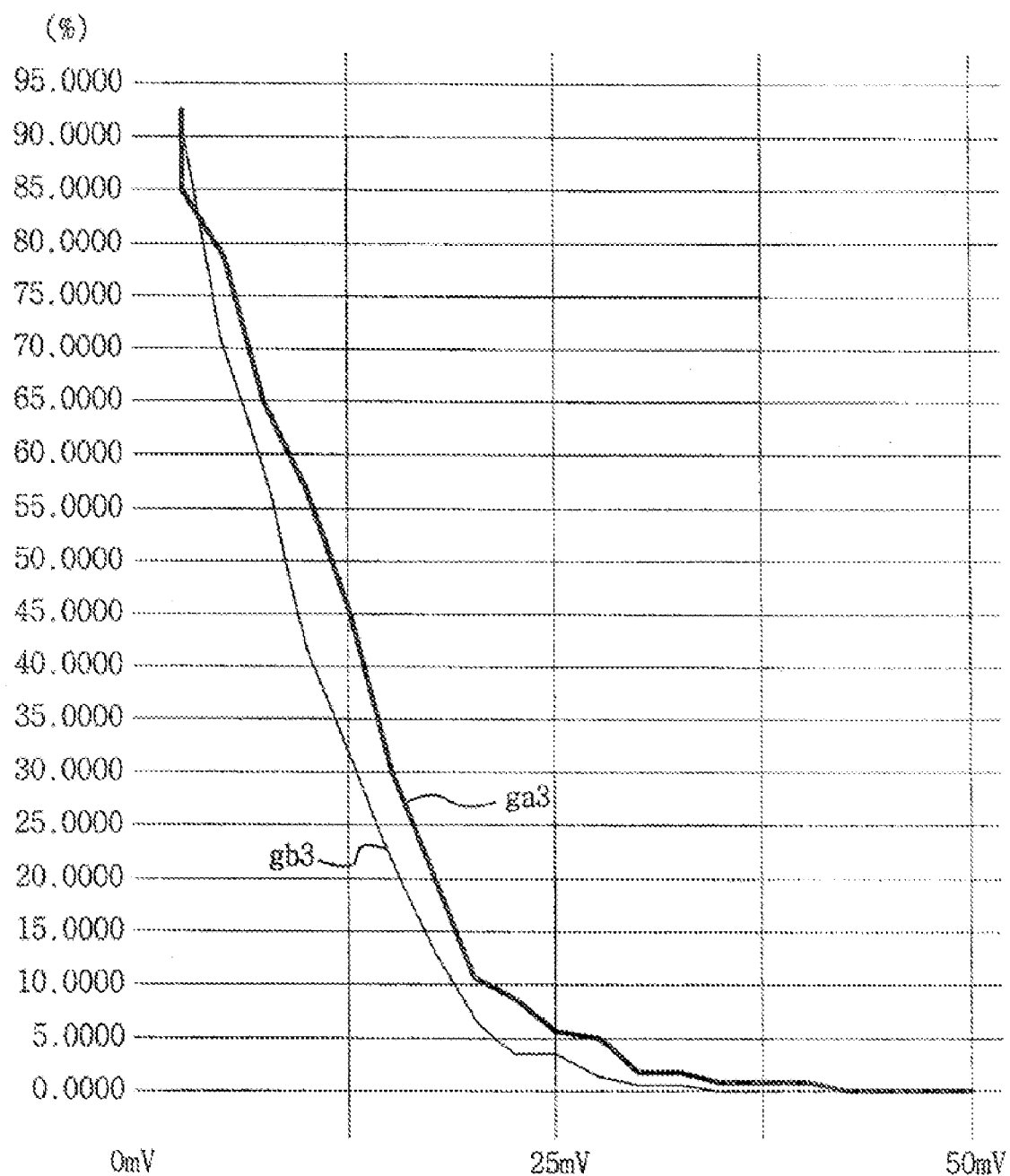
FIG. 16 is a graph comparing input sensitivity of conventional sense amplifier-based flip-flops and sense amplifier-based flip-flops according to an exemplary embodiment of the present invention.

FIG. 15 is a graph comparing setup/hold windows of conventional sense amplifier-based flip-flops and sense amplifier-based flip-flops according to an exemplary embodiment of the present invention, and FIG. 16 is a graph comparing input sensitivity of conventional sense amplifier-based flip-flops and sense amplifier-based flip-flops according to an exemplary embodiment of the present invention.

Referring first to FIG. 15, the graph illustrates a setup/hold window plot gb1, gb2 of a conventional sense amplifier-based flip-flop, and a setup/hold window plot ga1, ga2 of an inventive sense amplifier-based flip-flop.

In the graph, an X axis indicates a time from clock signal CLK to an input signal, and a Y axis indicates a time from the clock signal CLK to an output signal. The setup/window plot provides a delay of output signal based on an input time of the input signal D, /D in the sense amplifier-based flip-flop circuit.

In an exemplary embodiment of the present invention, a time from the clock signal to the input signal may be determined to be shorter by about 60 psec than the conventional time, because in FIG. 15, an overlapping portion of the setup graph gb1, gb2 is about 50 psec in the conventional circuit, and an overlapping portion of the setup graph ga1, ga2 is about −10 psec in the exemplary embodiment. Like in the conventional circuit, the inventive circuit does not have and overlapping portion between the setup graph ga1 and the hold graph ga2, thus there is no hysteresis and an uncertainty window is very small, the uncertainty window indicating that the setup graph and the hold graph do not meet mutually or preserve a very wide gap.

Further, according to exemplary embodiments of the present invention, time from the clock signal to the output signal may be 180 sec reduced from about 240 psec of the conventional circuit, thereby improving an operating speed.

Referring subsequently to FIG. 16, and X axis indicates an input swing width and a Y axis indicates an error rate. FIG. 16 illustrates a simulation result for an error rate of output based on a change of input swing under a random mismatch condition for various elements of the sense amplifier-based flip-flop. As shown in FIG. 16 there is not a large difference in input sensitivity ga3 of the sense amplifier-based flip-flop according to an exemplary embodiment of the present invention as compared with the sensitivity gb3 of a conventional sense amplifier-based flip-flop, the input sensitivity indicating a condition that the operation is without error is performed when an input swings with a substantial extent.

Consequently, as shown in FIGS. 15 and 16, the sense amplifier-based flip-flop according to exemplary embodiments of the present invention may satisfy various conditions as the design target of a sense amplifier-based flip-flop, and simultaneously may reduce a delay of from a clock signal to an output signal.

Figure 17:
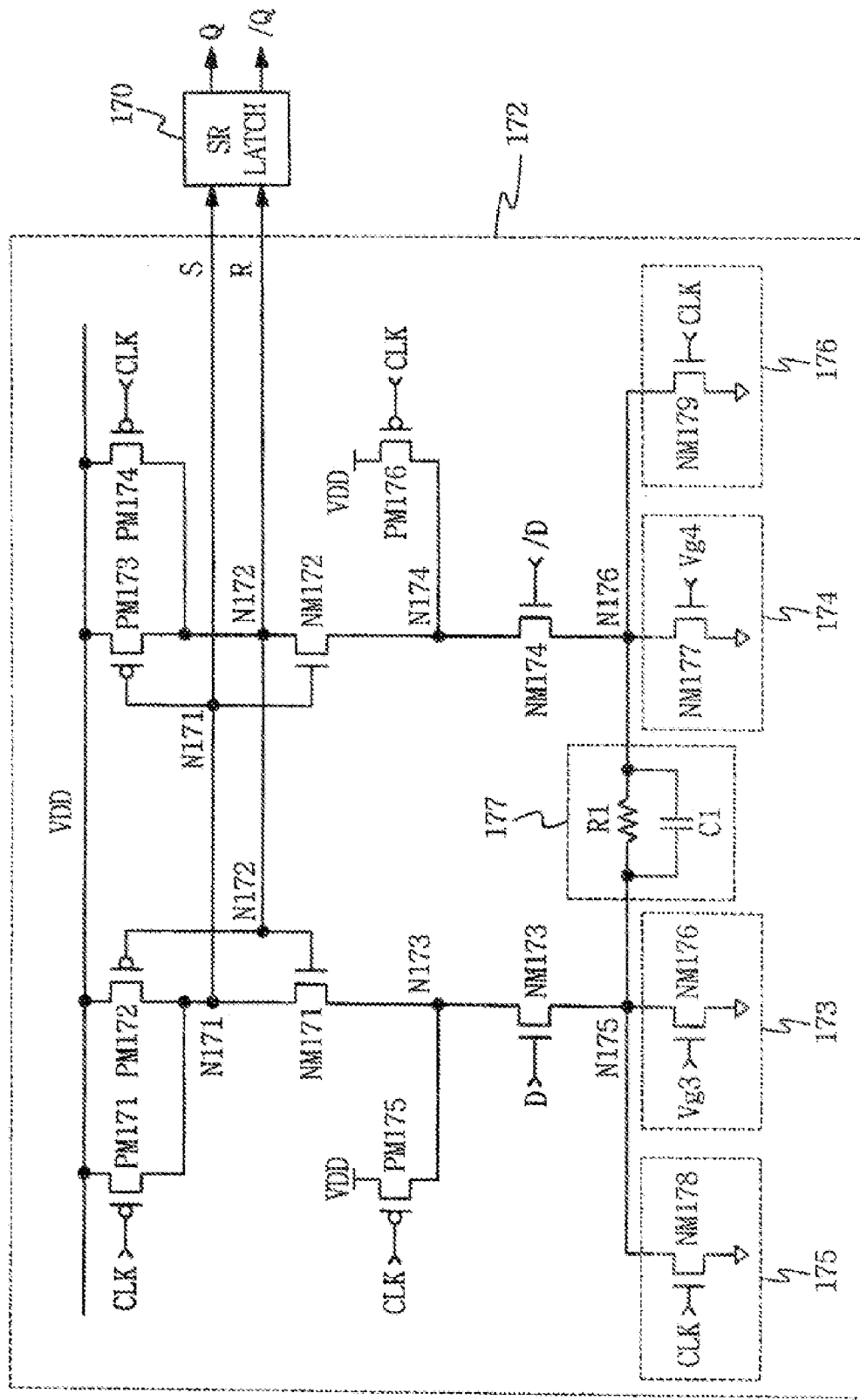
FIG. 17 is a circuit diagram of a sense amplifier-based flip-flop according to an exemplary embodiment of the present invention.

FIG. 17 is a circuit diagram of a sense amplifier-based flip-flop according to an exemplary embodiment of the present invention.

With reference to FIG. 17, a sense amplifier-based flip-flop operating in response to clock signal CLK includes a first latch 172, a second latch 170, a delay reduction unit 173, 174 and a high pass filter 177.

The first latch 172 outputs a second logic level signal to a first output terminal pair when the clock signal CLK has a first logic level, and outputs an evaluation signal pair corresponding to the input signal pair D, /D to the first output terminal pair S, R when the clock signal CLK has a second logic level.

The first logic level may a low logic level, and the second logic level may be a high logic level. Like in the above-description it will be described with an example for the first logic level as a low logic level and the second logic level as a high logic level, as follows.

The first latch 172 includes a first PMOS transistor PM171 disposed between a power terminal VDD and a first node N171 and turned on or off in response to the clock signal CLK, a second PMOS transistor PM172 disposed between the power terminal VDD and the first node N171, a gate terminal thereof being connected to the second node N172, and a first NMOS transistor NM171 disposed between the first node N171 and a third node N173, a gate terminal thereof being connected to the second node N172.

The first node N171 has a high logic level when the clock signal CLK has a low logic level, and has a first evaluation signal as one of the evaluation signal pair when the clock signal CLK has a high logic level. The second node N172 has a high logic level when the clock signal CLK has a high logic level, and has a second evaluation signal as another of the evaluation signal pair when the clock signal CLK has a high logic level. The first node N171 and the second node N172 may be the first output terminal pair S, R.

Further, the first latch 172 includes a third PMOS transistor PM173 disposed between the power terminal VDD and the second node N172, a gate terminal thereof being connected to the first node N171, a fourth PMOS transistor PM174 disposed between the power terminal VDD and the second node N172, and turned on or off in response to the clock signal CLK, and a second NMOS transistor NM172 disposed between the second node N172 and a fourth node N174, a gate terminal thereof being connected to the first node N171.

In addition, the first latch 172 includes a third NMOS transistor NM173 disposed between the third node N173 and a fifth node N175, and controlled by a first input signal D as one of the input signal pair D, /D, and fourth NMOS transistor NM174 disposed between the fourth node N174 and a sixth node N176 and controlled by second input signal as another of the input signal pair D, /D.

Furthermore, the first latch 172 includes a fifth PMOS transistor PM175 operationally connected to the third node N173 through the clock signal CLK, to provide power source voltage VDD to the third node N173, and a sixth PMOS transistor PM176 operationally connected to the fourth node N174 through the clock signal CLK, to provide the power source voltage VDD to the fourth node N174.

The first latch 172 also includes current passing transistors NM178 and NM179 disposed between the fifth node N175 and a ground terminal and between the sixth node N176 and the ground terminal, and turned on or off in response to the clock signal CLK.

The second latch 170 latches the evaluation signal pair and outputs the evaluation signal pair to a second output terminal pair Q, /Q.

The delay reduction unit 173, 174 is connected with current passing nodes N175 and N176 of the first latch 172, and reduces a signal delay time of from a transition point of time when the clock signal CLK is transited from a first logic level to a second logic level, to a point of time when the evaluation signal pair output from the second output terminal pair Q, /Q.

The delay reduction unit 173, 174 is always turned on by an applied bias voltage Vg3, Vg4, thus current from the third or fourth node N173 or N174 is passed to a ground terminal, so as to enable the third and fourth nodes N173 and N174 to have different logic levels when the clock signal CLK has a low logic level. When the clock signal CLK has a low logic level, the logic levels of the third node N173 and the fourth node N174 have a difference, thereby reducing a delay of from the clock signal CLK to the output signal Q, /Q as describe above.

The delay reduction unit 173, 174 may be NMOS transistors NM178 and NM179 whose gate terminals each are supplied with an bias voltage Vg3, Vg4, whose drain terminals are each connected to the fifth node N175 and the sixth node N176 and whose source terminals are each coupled to a ground terminal.

The bias voltage Vg3, Vg4 may be satisfied with voltage enough to turn on the NMOS transistors NM178, NM179. Thus, the bias voltage Vg3, Vg4 may be power source voltage VDD.

The high pass filter 177 is connected between the current passing nodes N175 and N176 of the first latch 172, so as to prevent a degradation of an output characteristic based on frequency even in a high frequency of the input signal pair D, /D.

The high pass filter 177 may include a resistor R1 and a capacitor C1 connected in parallel between the fifth node N175 and the sixth node N176.

In comparing the circuit of FIG. 13 with the circuit of FIG. 17, in the circuit of FIG. 17 the high pass filter 177 divides a node N135 of FIG. 13 left and right, providing a current source 173, 174 to each node, and so a resistor R1 and a capacitor C1 are connected in parallel between the divided nodes, thereby a source peaking technique is applied thereto.

The source peaking technique is to reduce a gain in a low frequency and preserve a gain in a high frequency, thereby elimination an ISI (inter symbol interference).

Thus, the high pass filter 177 may reduce a gain of low frequency and preserve a gain of high frequency, removing the ISI.

Figure 18:
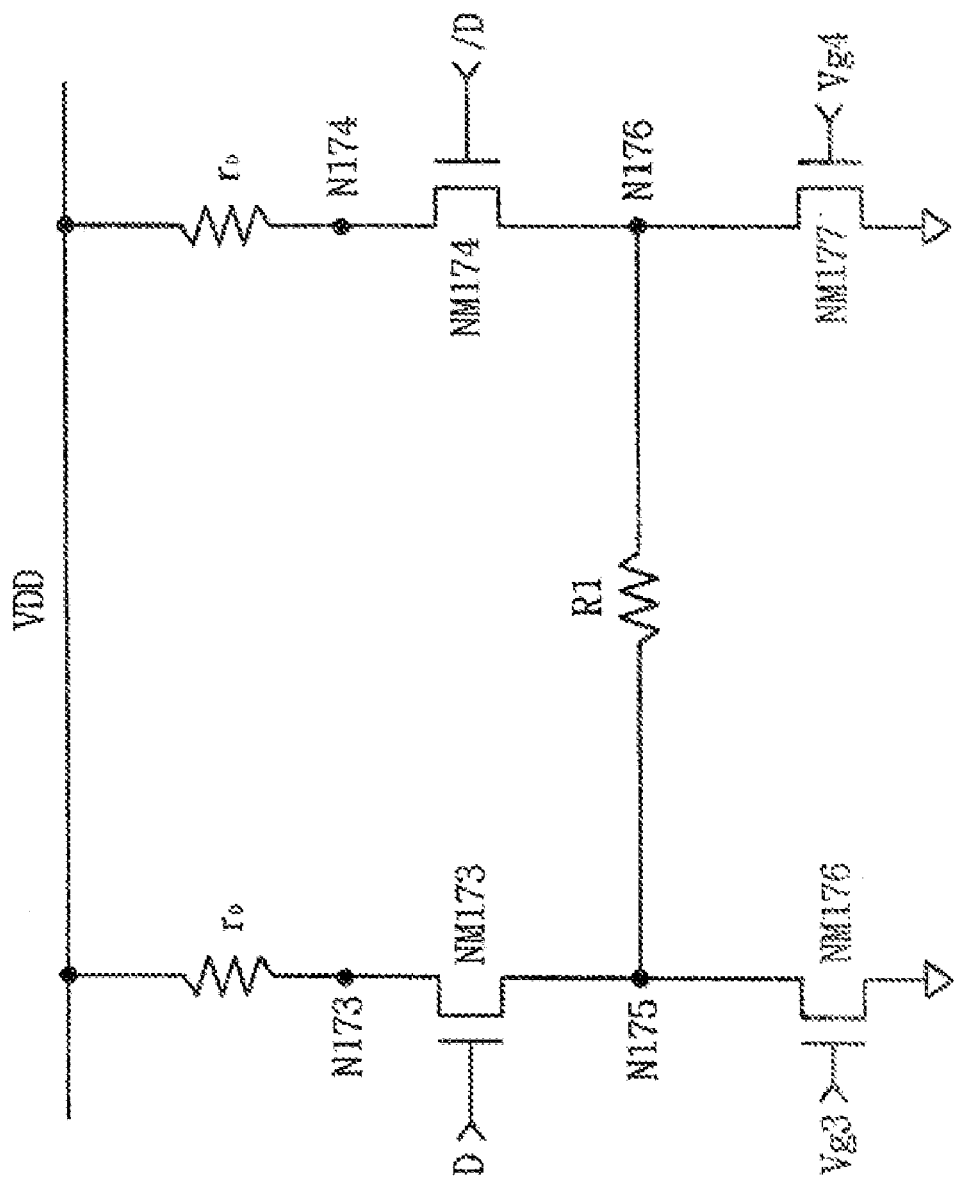
FIG. 18 is an equivalent circuit diagram of the sense amplifier-based flip-flop of FIG. 17 when an input signal pair has a low frequency.
Figure 19:
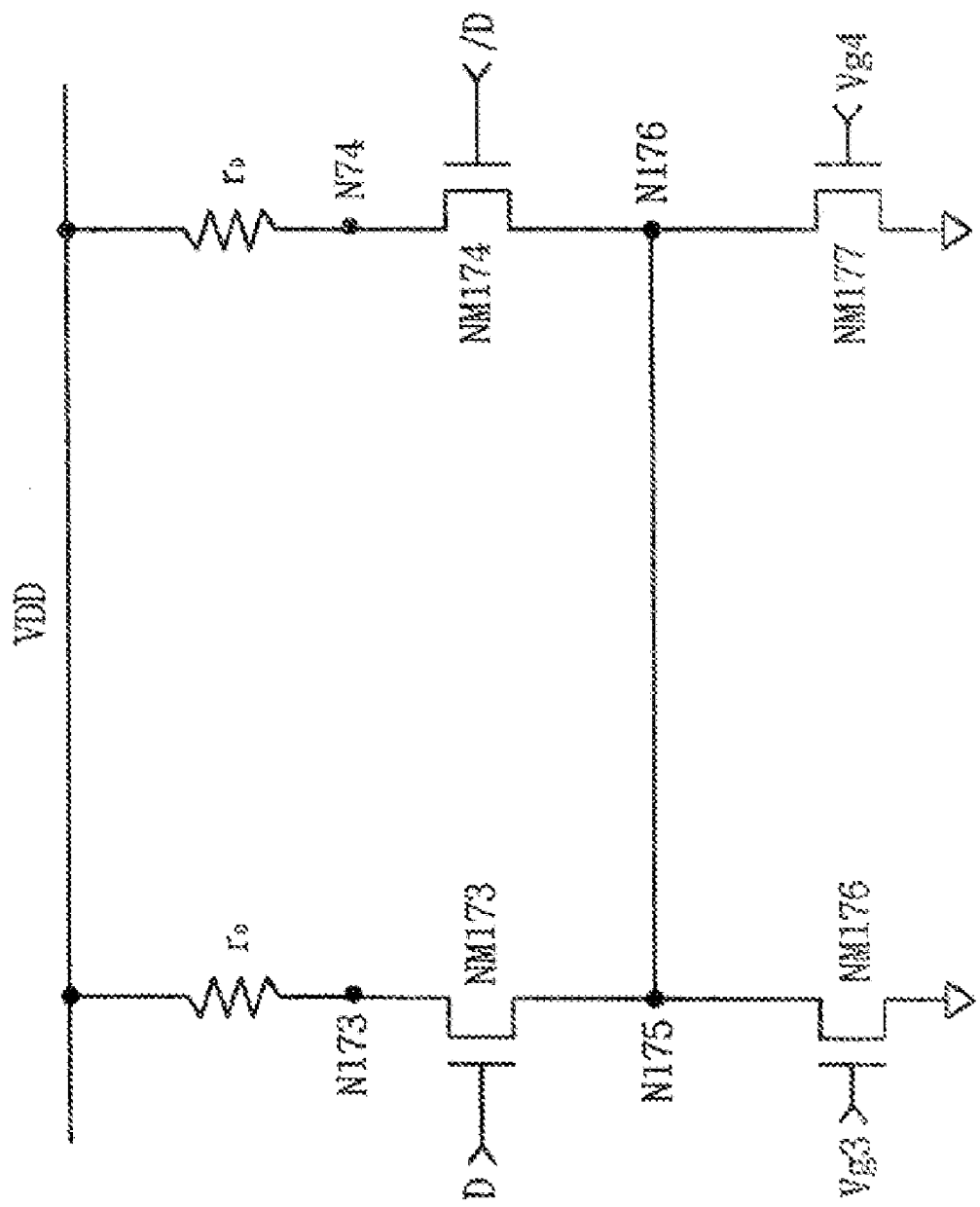
FIG. 19 is an equivalent circuit diagram of the sense amplifier-based flip-flop of FIG. 17 when the input signal pair has a high frequency.

FIGS. 18 and 19 illustrate operation of the circuit of FIG. 17, where FIG. 18 is an equivalent circuit diagram of the sense amplifier-based flip-flip of FIG. 17 when an input signal pair has a low frequency, and FIG. 19 is an equivalent circuit diagram of the sense amplifier-based flip-flop of FIG. 17 when the input signal pair has a high frequency.

Referring first to FIG. 18, an equivalent circuit for a portion of high pass filter (77 of FIG. 17) is shown, being provided when in FIG. 17, clock signal CLK has a low logic level and the input signal pair D, /D has a low frequency.

When the input signal pair D, /D has a low frequency, a switching speed of NMOS transistor NM173, NM174 is slow, thus a capacitor C1 may be disregarded in a high pass filter (77 of FIG. 17) connected between a node N175 and a node N176, that is, the filter 77 can be provided only with a resistor R1.

At this time, in considering as an output for between node N173 and Node N174, a gain of output for the input signal pair D, /D may be 'gain=gm*ro/{1+gm(R1/2)}', wherein the resistance of the resistor R1 is represented as $R_E$ in the graph.

In the expression, gm indicates a transconductance as a parameter providing a characteristic of transistor, and ro indicates an operation resistance of PMOS transistor PM175, PM176.

Referring subsequently to FIG. 19, an equivalent circuit for a portion of the high pass filter (77 of FIG. 17) is shown, for a case that in FIG, 17, the clock signal CLK has a low logic level and the input signal pair D, /D has a high frequency.

When the input signal pair D, /D has a high frequency, a switching speed of NMOS transistor NM173, NM174 is speedy, thus a resistor R1 may be disregarded in the high pass filter (77 of FIG. 17) connected between the node N175 and the node N176, and the capacitor C1 may be shown as a conduction state. That is, when the input signal pair D, /D has a high frequency, the nodes N175 and N176 may be regarded as one node.

Likewise, in considering as an output for between the node N173 and the node N174, a gain of output for the input signal pair D, /D may be 'gain=gm*ro'.

Figure 20:
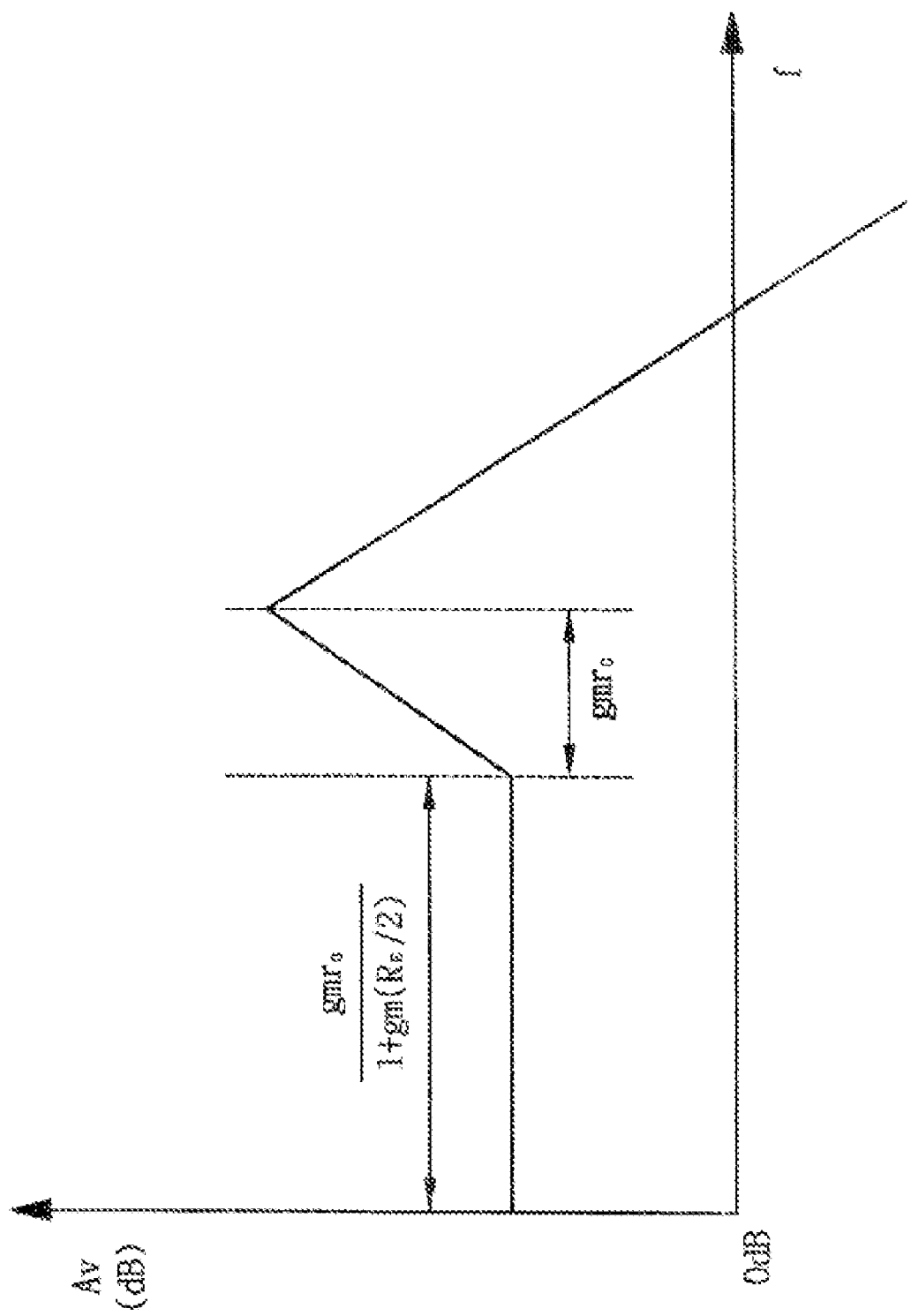
FIG. 20 is a graph illustrating output gain based on frequency variation of the input signal pair.

FIG. 20 is a graph illustrating output gain based on frequency variation of the input signal pair.

As shown in FIG. 20, below a given frequency, a low gain is provided, and in more than the given frequency the gain increases and then rapid decreases. The low gain below a given frequency was described with reference to FIG. 18, and the high gain in more than the given frequency was described with reference to FIG. 19. The rapid decreased gain is caused by a limit of sense amplifier flip-flop itself.

As described above, the sense amplifier-based flip-flop shown in FIG. 17 provides a characteristic of a high pass filter.

Figure 21:
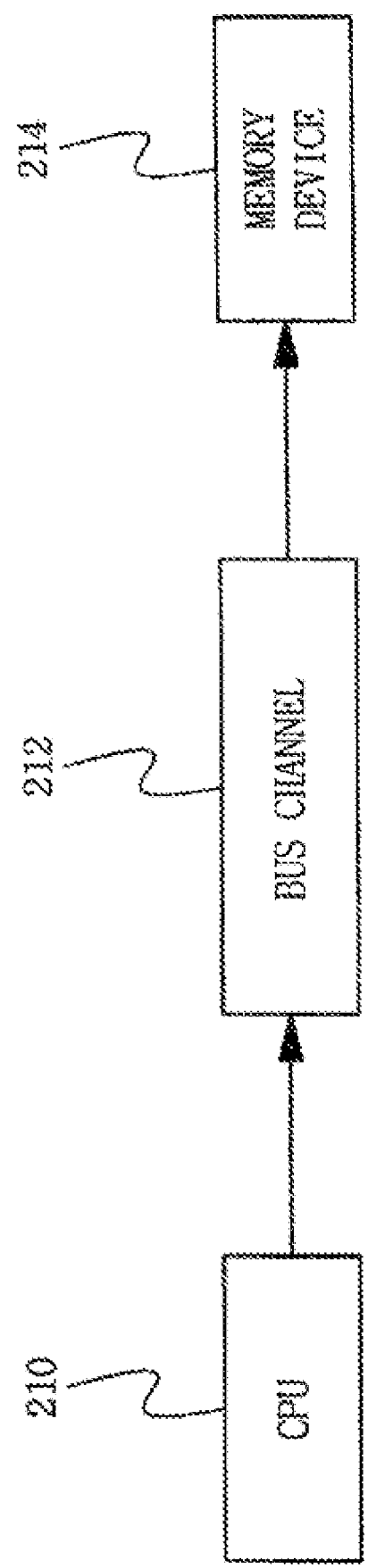
FIG. 21 is a block diagram of a system employing a memory device having the sense amplifier-based flip-flop of FIG. 17.

FIG. 21 is a block diagram of a system employing a memory device having the sense amplifier-based flip-flop of FIG. 17.

With reference to FIG. 21, a memory device 214 is coupled to a CPU (Central Processing Unit) 210 through a bus channel 212. The bus channel 212 generally has a characteristic of a low pass filter. Thus, in a signal having a high frequency, a filtering effect through the bus channel 212 is generated, and so an operating characteristic of the system is degraded, for example, frequent ISI is caused.

However, an operating characteristic of the system may be improved by employing the inventive sense amplifier-based flip-flip in the semiconductor device. That is, a high pass filter is equipped within the inventive sense amplifier-based flip-flop, thereby eliminating the ISI through the source peaking technique a low frequency signal reduces a gain and a high frequency signal maintains a gain.

Figure 22:
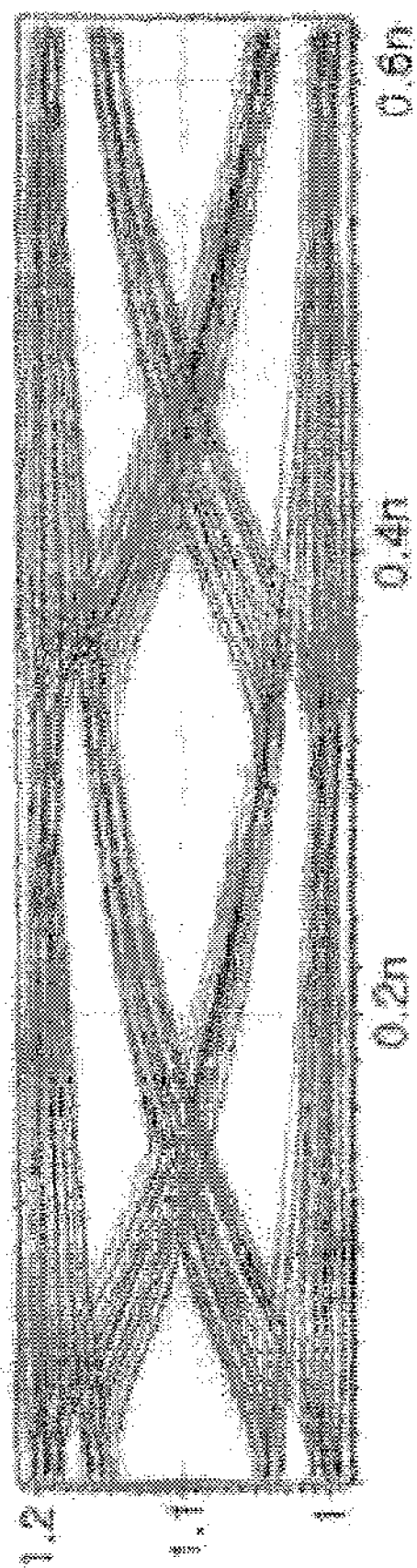
FIG. 22 is a graph illustrating a waveform of an input signal.
Figure 23:
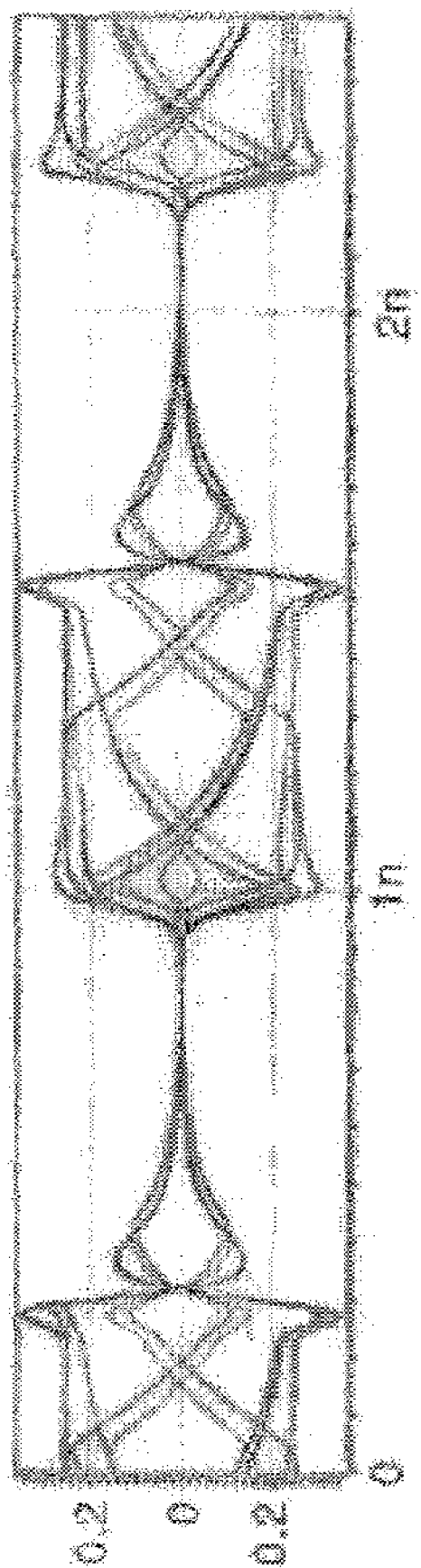
FIG. 23 is a graph illustrating an operation characteristic based on the input signal of FIG. 22 in a sense amplifier-based flip-flop without a high pass filter.
Figure 24:
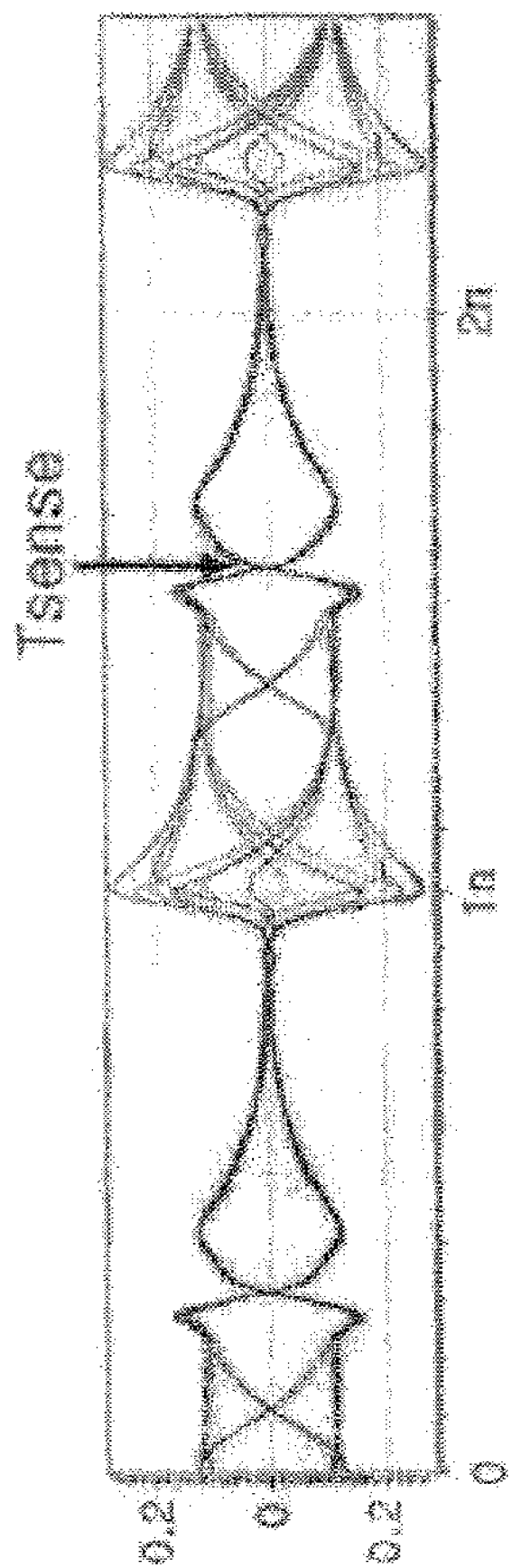
FIG. 24 is a graph illustrating an operation characteristic based on the input signal of FIG. 22 in the sense amplifier-based flip-flop of FIG. 17.

FIGS. 22 to 24 provide ISI reduction according to an exemplary embodiment of the present invention. FIG. 22 is a graph illustrating a waveform of an input signal, FIG. 23 is a graph illustrating an operation characteristic based on the input signal of FIG. 22 in the sense amplifier-based flip-flop without a high pass filter, and FIG. 24 is a graph illustrating an operation characteristic based on the input signal of FIG. 22 in the sense amplifier-based flip-flop of FIG. 17.

With reference to FIG. 22, an eye pattern of input signal is provided, with much ISI generation between input signals. In particular, in case an input signal is passed through a bus channel having a relatively small band width, e.g., 212 of FIG. 21, and so ISI is generated, a margin of setup/hold time for a voltage margin is lessened.

Referring to FIG. 23, if a signal having much ISI generation like in FIG. 22 is applied to s sense amplifier-based flip-flop of, e.g., FIG. 13, to which the source peaking technique is not applied; in the waveform output from nodes N133 and N134 of FIG. 13, a signal with ISI is produced similarly to in the input signal of FIG. 22.

With reference to FIG. 24, ISI is removed by the source peaking technique as compared with FIG. 23, thus the waveform of the node N173, N174 (FIG. 17) is output relatively clearly. When the clock signal CLK becomes a high logic level Tsense, the input signal is sensed and amplified, thus a setup/hold time or voltage margin may increase.

Further, in an input signal with ISI like in FIG. 22, a delay from a clock signal to an output signal is about 250 psec (gb1, gb2 of FIG. 15) and abut 190 psec (ga1, ga2 of FIG. 15) when the source peaking technique is not applied as shown in FIG. 15, meanwhile, when the source peaking technique is applied to the sense amplifier-based flip-flop as shown in FIG. 17, the improved delay may be provided as about 170 psec(not shown).

The sense amplifier-based flip-flop to reduce a delay time from the clock signal to the output signal according to exemplary embodiments of the present invention was described above, and a sense amplifier circuit of the sense amplifier-based flip-flop will be described as follows.

Referring to FIG. 13, a first latch 132 of the sense amplifier-based flip-flop may be a current sensing sense amplifier. Although the above description has been made about the case where the first latch 132 and the delay reduction unit 133, 134 were provided as separate configurative elements; in the following description the first latch 132 and the delay reduction unit 133, 134 will be provided with configuration of one sense amplifier circuit.

According to exemplary embodiments of the present invention, a sense amplifier circuit 132, 133, 134, which operates in response to a clock signal CLK, senses and amplifies an input signal pair D, /D when the clock signal CLK has a high logic level, and generates its corresponding output signal pair S, R, may include one pair of precharge enable switches PM131, PM134, a latch PM132, NM131, PM133, NM132, a voltage variation reduction unit PM135, PM136, and input signal applying unit NM133, NM134, a ground switch NM135 and a delay reduction unit 133, 134.

The precharge enable switch may be constructed of two PMOS transistors PM131 and PM134. One PMOS transistor PM131 is connected between power terminal VDD and first node N131, and another is connected between the power terminal VDD and second node N132, thus when the clock signal CLK has a low logic level, voltage of the first and second nodes N131 and N132 becomes a high logic level.

The latch PM132, NM131, PM133, NM132 is constructed of two inverters. A first inverter including a PMOS transistor PM132 and an NMOS transistor NM131 has the first node N131 as an output terminal, and the second node N132 as an input terminal. A second inverter including a PMOS transistor PM133 and an NMOS transistor NM132 has the first node N131 as an input terminal and the second node N132 as an output terminal.

The voltage variation reduction unit PM135, PM136 is connected to each of third node N133 and fourth node N134 of the sense amplifier circuit as the current passing nodes of the latch PM132, NM131, PM133, NM132, and prevents a voltage variation of the third node N133 and the fourth node N134, particularly a voltage drop.

The voltage variation reduction unit PM135, PM136 may be constructed of PMOS transistor PM135, PM136 controlled by the clock signal CLK.

When the clock signal CLK has a low logic level, the PMOS transistor PM135, PM136 is turned on, so as to prevent an effect a voltage of the third node N133 and the fourth node N134 is lowered by a threshold voltage through NMOS transistor NM131, NM132.

When the clock signal CLK is transited to a high logic level, the PMOS transistor PM135, PM136 is turned off. At this time, the PMOS transistor PM135, PM136 does not influence a logic level of the third node N133 and the fourth node N134.

The input signal applying unit NM133, NM134 includes an input transistor NM133 disposed between the third node N133 and a fifth node N135, to receive first input signal D, and an input transistor NM134 connected between the fourth node N134 and the fifth node N135, to receive a second input signal /D.

For example, when the clock signal CLK has a high logic level and a logic level of the first input signal D is higher than a logic level of the second input signal /D, the input transistor NM133 is turned on more strongly than the input transistor NM134, thus the third node N133 and the first node N131 become a low logic level, and the second node N132 remains as a high logic level.

The ground switch NM135 is connected between the fifth node N135 and a ground terminal, and is controlled by the clock signal CLK. That is the ground switch NM135 is coupled to the input signal applying unit NM133, NM134, and is turned on or off in response to the clock signal CLK, thereby passing current of the input signal applying unit NM133, NM134 to ground terminal. For example, as shown in FIG. 13, the ground switch NM135 is turned on when the clock signal CLK has a high logic level, and is turned off when the clock signal CLK has a low logic level, thereby passing current of the input signal applying unit NM133, NM134 to the ground terminal.

The delay reduction unit 133, 134 is connected to the input signal applying unit NM133, NM134, and enables the current passing nodes N133 and N134 to have a different logic level when the clock signal CLK has a low logic level. The delay reduction unit 133, 134 may be at least one NMOS transistor NM136, NM137. In other words, although the delay reduction unit 133, 134 is shown being divided into two NMOS transistors NM136 and NM137 in FIG. 13, it may be one NNMOS transistor NM136, or may be three or more NMOS transistors. In the NMOS transistors NM136 and NM137, a bias voltage Vg1 Vg2 is applied to a gate terminal, and a drain terminal is coupled to the input signal applying unit NM133, NM134, namely, to a node N135, and a source terminal is coupled to a ground terminal. The bias voltage may be Vg1, Vg2 may be a power source voltage VDD. Thus, the delay reduction unit NM136, NM137 is always turned on by an applied bias voltage Vg1, Vg2 and so passes current of the current passing nodes N133 and N134 to the ground terminal.

The operation of the sense amplifier circuit was described above with the description of the sense amplifier-based flip-flop, thus a repetitive description will be omitted.

A sense amplifier-based flip-flop according to exemplary embodiments of the present invention will be described referring to FIGS. 12, 13 and 17.

The sense amplifier-based flip-flop according exemplary embodiments of the prevent invention includes a first latch configured to output a second logic level signal to a first output terminal pair when a clock signal has a first logic level, and output an evaluation signal pair corresponding to an input signal pair to the first output terminal pair when the clock signal has a second logic level; a second latch configured to latch the evaluation signal pair and to output the evaluation signal pair to second output terminal pair; a floating preventing unit configured to be controlled by signals of the first output terminal pair and so be operationally connected between current passing nodes of the first latch so as to prevent the first output terminal pair from floating; and input signal applying unit disposed between the current passing nodes of the first latch and a ground terminal, for receiving each of the input signal pair; a ground switch disposed between the input signal applying unit and the ground terminal, and controlled by the clock signal and so turned on or off; and a delay reduction unit disposed between the input signal applying unit and the ground switch, for reducing a signal delay time of from a transition point of time when the clock signal is transited from a first logic level to a second logic level to a point of time when the evaluation signal pair is output from the second output terminal pair.

The first latch, second latch, floating preventing unit, input signal applying unit and ground switch are shown in FIG. 12, and the description therefore is the same as the afore-described embodiments. An example of the delay reduction unit is illustrated with reference numbers 134 and 135 of FIG. 13. That is, the sense amplifier-based flip-flop according to the embodiment of the invention has the configuration the reference numbers 134 and 135 are added to the circuit of FIG. 12.

Accordingly, the sense amplifier-based flip-flop according to an exemplary embodiment of the present invention may improve input sensitivity by resolving a floating situation and by reducing delay time.

Furthermore, the sense amplifier-based flip-flop may further include a high pass filter that is connected between current passing nodes of the input signal applying unit so as to prevent a degradation of output characteristic even a high frequency of the input signal pair.

An example of the high pass filter is shown in FIG. 17.

Consequently, a sense amplifier-based flip-flop according to some embodiments of the invention may solve a floating situation and improve an input sensitivity, and simultaneously, improve and solve a delay time and an ISI situation of an input signal.

A sense amplifier circuit and a sense amplifier-based flip-flop having the same structure described above according to the exemplary embodiments of the present invention may applied to an input/output (I/O) sense amplifier of a semiconductor memory device, and to a sense amplifier in a data write path, et., and in particularly, may be applied to systems requiring a stable operation with high clock speeds.

As described above, according to exemplary embodiments of the present invention, a sense amplifier circuit and a sense amplifier-based flip-flop having the same are provided, thereby floating an output terminal as an input terminal of slave latch. may be improved.

In addition, a data loss and a drop in an input sensitivity may be improved.

Further, in a sense amplifier circuit and a sense amplifier-based flip-flop having the same according to exemplary embodiments of the present invention, a delay time from a clock signal to an output signal may be reduced, thus improving an operating speed of memory device and enabling to easily design a back portion of the sense amplifier-based flip-flop.

Furthermore, an ISI effect of a signal applied to the sense amplifier circuit may be reduced, thereby substantially reducing a loss of data, operation defects, etc.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed exemplary embodiments of the present invention and, although specific terms are employed, they are used in a generic and descriptive sense only and not for purposes of limitation, the scope of the invention being set forth in the following claims.

What is claimed is:

1. A sense amplifier-based flip-flop operating in response to a clock signal, the flip-flop comprising:
   a first latch configured to output a second logic level signal to a first output terminal pair regardless of an input signal pair when the clock signal has a first logic level, and to output an evaluation signal pair corresponding to the input signal pair to the first output terminal pair when the clock signal has the second logic level;
   a second latch configured to latch the evaluation signal pair and to output the evaluation signal pair to a second output terminal pair; and
   a floating preventing unit configured to be controlled by signals of the first output terminal pay and to be operationally connected between current passing nodes of the first latch to inhibit the first output terminal pair from floating.

2. The flip-flop of claim 1, wherein the first logic level is a low logic level and the second logic level is a high logic level.

3. The flip-flop of claim 2, wherein the first latch comprises:

a first node, which becomes a high logic level when the clock signal has a low logic level, and which has a first evaluation signal when the clock signal has a high logic level; and a second node, which becomes a high logic level when the clock signal has a low logic level, and which has a second evaluation signal when the clock signal has a high logic level, the first and second nodes being the first output terminal pair, and the first and second evaluation signals being the evaluation signal pair.

4. The flip-flop of claim 3, wherein the floating preventing unit is turned off when all output signals of the first node and the second node have a high logic level, and is turned on when any of the output signals of the first and second nodes has a low logic level.

5. The flip-flop of claim 4, wherein the floating preventing unit comprises first and second NMOS transistors, for which an inverted signal of the output signal of the first node is applied to a gate terminal of the first NMOS transistor, and an inverted signal of the output signal of the second node is applied to a gate terminal of the second NMOS transistor, and of which source and drain terminals are connected with each other.

6. The flip-flop of claim 4, wherein the floating preventing unit comprises first and second PMOS transistors, for which the output signal of the first node is applied to a gate terminal of the first PMOS transistor, and the output signal of the second node is applied to a gate terminal of the second PMOS transistor, and of which source and drain terminals are connected with each other.

7. The flip-flop of claim 4, wherein the floating preventing unit is a transmission gate controlled by an inverted signal of the output signal of the first node and the output signal of the second node.

8. The flip-flop of claim 4, wherein the first latch comprises:

a first PMOS transistor, which is disposed between a power terminal and the first node and is turned on or off in response to the clock signal;

a second PMOS transistor, which is disposed between the power terminal and the first node, and of which a gate terminal is connected to the second node;

a first NMOS transistor, which is disposed between the first node and a third node, and of which a gate terminal is connected to the second node;

a third PMOS transistor, which is disposed between the power terminal and the second node, and of which a gate terminal is connected to the first node;

a fourth PMOS transistor disposed between the power terminal and the second node, and turned on or off in response to the clock signal;

a second NMOS transistor, which is disposed between the second node and a fourth node, and of which a gate terminal is connected to the first node;

a third NMOS transistor disposed between the third node and a fifth node, and controlled by a first input signal of the input signal pair;

a fourth NMOS transistor disposed between the fourth node and the fifth node and controlled by a second input signal of the input signal pair; and a fifth NMOS transistor disposed between the fifth node and a ground terminal and turned on or off in response to the clock signal.

9. The flip-flop of claim 8, wherein the third and fourth nodes are the current passing nodes of the first latch.

10. The flip-flop of claim 8, wherein the floating preventing unit is operationally connected between the third node and the fourth node.

11. A sense amplifier circuit to operate in response to a clock signal, to sense and amplify an input signal pair, and to generate a corresponding output signal pair, the circuit comprising:

one pair of precharge enable switches, of which a first precharge enable switch of the pair of precharge enable switches is disposed between a power terminal and a first node, and a second precharge enable switch of the pair of precharge enable switches is disposed between the power terminal and a second node, wherein a voltage level of the first and second nodes becomes a second logic level when the clock signal has a first logic level;

a latch including a first inverter having the first node as an output terminal and the second node as an input terminal, and a second inverter having the first node as an input terminal and the second node as an output terminal;

a floating preventing unit, which is controlled by output signals of the first and second nodes and which is operationally connected between first and second current passing nodes of the latch to inhibit the first or second node from floating;

an input signal applying unit disposed between the first and second current passing nodes of the latch and a ground terminal, to receive the input signal pair; and a ground switch disposed between the input signal applying unit and the ground terminal, and controlled to turn on or off in response to the clock signal.

12. The circuit of claim 11, wherein the first and second current passing nodes are a third node being one end of a first NMOS transistor constituting the first inverter, and a fourth node being one end of a second NMOS transistor constituting the second inverter.

13. The circuit of claim 11, wherein the first logic level is a low logic level and the second logic level is a high logic level.

14. The circuit claim 13, wherein the floating preventing unit is turned off when all of the output signals of the first and second nodes have a high logic level, and is turned on when any one of the output signals of the first and second nodes has a low logic level.

15. The circuit of claim 14, wherein the input signal applying unit comprises:

a first input transistor disposed between the first current passing node and the ground switch, for receiving a first input signal as one of the input signal pair, and a second input transistor disposed between the second current passing node and the ground switch, for receiving a second input signal as one of the input signal pair.

16. A sense amplifier-based flip-flop operating in response to a clock signal, comprising:

a first latch configured to output a second logic level signal to a first output terminal pair when the clock signal has a first logic level, and to output an evaluation signal pair corresponding to an input signal pair to the first output terminal pair when the clock signal has a second logic level;

a second latch configured to latch the evaluation signal pair and to output the evaluation signal pair to a second output terminal pair; and a delay reduction unit coupled to a current passing node of the first latch, for reducing a signal delay time of from a transition point of time when the clock signal is transited from a first logic level to a second logic level to a point of time when the evaluation signal pair is output from the second terminal pair.

17. The flip-flop of claim 16, wherein the first logic level is a low logic level and the second logic level is a high logic level.

18. The flip-flop of claim 17, wherein the first latch comprises:
   a first node having a high logic level when the clock signal has a low logic level, and having a first evaluation signal when the clock signal has a high logic level; and
   a second node having a high logic level when the clock signal has a low logic level, and having a second evaluation signal when the clock signal has a high logic level,
   the first and second node being the first output terminal pair, and the first and second evaluation signals being the evaluation signal pair.

19. The flip-flop of claim 18, wherein the first latch comprises:
   a first PMOS transistor disposed between a power terminal and the first node, and turned on or off in response to the clock signal;
   a second PMOS transistor disposed between the power terminal and the first node, a gate terminal of the second PMOS transistor being connected to the second node;
   a first NMOS transistor disposed between the first node and a third node, a gate terminal of the first NMOS transistor being connected to the second node;
   a third PMOS transistor disposed between the power terminal and the second node, a gate terminal of the third PMOS transistor being connected to the first node;
   a fourth PMOS transistor disposed between the power terminal and the second node, and turned on or off in response to the clock signal;
   a second NMOS transistor disposed between the second node and a fourth node, a gate terminal of the second NMOS transistor being connected to the first node;
   a third NMOS transistor disposed between the third node and a fifth node as a current passing node, and controlled by a first input signal as one of the input signal pair;
   a fourth NMOS transistor disposed between the fourth node and the fifth node, and controlled by a second input signal as another of the input signal pair;
   a fifth PMOS transistor operationally connected to the third node through the clock signal so as to provide power source voltage to the third node;
   a sixth PMOS transistor operationally connected to the fourth node through the clock signal so as to provide power source voltage to the fourth node; and
   a fifth NMOS transistor disposed between the fifth node and a ground terminal, and turned on or off in response to the clock signal.

20. The flip-flop of claim 19, wherein the delay reduction unit enables the third and fourth nodes to have different logic levels when the clock signal has a low logic level.

21. The flip-flop of claim 20, wherein the delay reduction unit is always turned on by an applied bias voltage, to pass current from the third or fourth node to the ground terminal.

22. The flip-flop of claim 21, wherein the bias voltage is a power source voltage.

23. A sense amplifier circuit operating in response to a clock signal, for sensing and amplifying and input signal pair when the clock signal has a high logic level, and generating its corresponding output signal pair, the circuit comprising:
   one pair of precharge enable switches operating to enable voltage of first and second nodes to become a high logic level when the clock signal has a low logic level, one of the precharge enable switches being disposed between a power terminal and the first node, and another thereof being disposed between the power terminal and the second node;
   a latch including first and second inverters, the first inverter having the first node as an output terminal and the second node as an input terminal, and the second inverter having the first node as an input terminal and the second node as an output terminal;
   a voltage variation preventing unit for stabilizing voltage of current passing nodes of the latch when the clock signal has a low logic level;
   an input signal applying unit coupled with the current passing nodes of the latch, for receiving the input signal pair;
   a ground switch connected to the input signal applying unit, and turned on or off in response to the clock signal so as to pass current of the input signal applying unit to a ground terminal; and
   a delay reduction unit connected to the input signal applying unit, for enabling the current passing nodes to have different logic levels when the clock signal has a low logic level.

24. The circuit of claim 23, wherein the delay reduction unit is always turned on by an applied bias voltage, to pass current of the current passing nodes to the ground terminal.

25. The circuit of claim 24, wherein the delay reduction unit is at least one NMOS transistor whose gate terminal is supplied with the bias voltage, whose drain terminal is connected to the input signal applying unit, and whose source terminal is connected to the ground terminal.

26. A sense amplifier-based flip-flop operating in response to a clock signal, comprising:
   a first latch for outputting a second logic level signal to a first output terminal pair when the clock signal has a first logic level, and outputting an evaluation signal pair corresponding to an input signal pair to the first output terminal pair when the clock signal has a second logic level;
   a second latch configured to latch the evaluation signal pair and to output the evaluation signal pair to a second output terminal pair;
   a delay reduction unit connected with current passing nodes of the first latch, for reducing a signal delay time of from a transition point of time when the clock signal is transited from a first logic level to a second logic level to a point of time when the evaluation signal pair is output from the second output terminal pair; and
   a high pass filter connected between the current passing nodes of the first latch, so as to prevent a degradation of output characteristic based on frequency even in a high frequency of the input signal pair.

27. The flip-flop of claim 26, wherein the first logic level is a low logic level and the second logic level is a high logic level.

28. The flip-flop of claim 27, wherein the first latch comprises:
   a first node having a high logic level when the clock signal has a low logic level, and having a first evaluation signal when the clock signal has a high logic level; and
   a second node having a high logic level when the clock signal has a low logic level, and having a second evaluation signal when the clock signal has a high logic level,
   the first and second nodes being the first output terminal pair, and the first and second evaluation signals being the evaluation signal pair.

29. The flip-flop of claim 28, wherein the first latch comprises:
- a first PMOS transistor disposed between a power terminal and the first node, and turned on or off in response to the clock signal;
- a second PMOS transistor disposed between the power terminal and the first node, a gate terminal of the second PMOS transistor being connected to the second node;
- a first NMOS transistor disposed between the first node and a third node, a gate terminal of the first NMOS transistor being connected to the second node;
- a third PMOS transistor disposed between the power terminal and the second node, a gate terminal of the third PMOS transistor being connected to the first node;
- a fourth PMOS transistor disposed between the power terminal and the second node, and turned on or off in response to the clock signal;
- a second NMOS transistor disposed between the second node and a fourth node, a gate terminal of the second NMOS transistor being connected to the first node;
- a third NMOS transistor disposed between the third node and a fifth node, and controlled by a first input signal pair;
- a fourth NMOS transistor disposed between the fourth node and a sixth node, and controlled by a second input signal as another of the input signal pair;
- a fifth PMOS transistor operationally connected to the third node through the clock signal so as to provide power source voltage to the third node;
- a sixth PMOS transistor operationally connected to the fourth node through the clock signal so as to provide power source voltage to the fourth node; and
- current passing transistors disposed between the fifth node and a ground terminal and between the sixth node and the ground terminal, and turned on or off in response to the clock signal.

30. The flip-flop of claim 29, wherein the delay reduction unit is always turned on by an applied bias voltage, so as to pass current from the third or fourth node to the ground terminal and so enable the third and fourth nodes to have different logic levels when the clock signal has a low logic level.

31. The flip-flop of claim 29, wherein the high pass filter comprises a resistor and a capacitor connected in parallel between the fifth node and the sixth node.

32. A sense amplifier-based flip-flop operating in response to a clock signal, comprising:
- a first latch for outputting a second logic level signal for a first output terminal pair when the clock signal has a first logic level, and outputting an evaluation signal pair corresponding to an input signal pair to the first output terminal pair when the clock signal has a second logic level;
- a second latch configured to latch the evaluation signal pair and to output the evaluation signal pair to a second output terminal pair;
- a floating preventing unit controlled by signals of the first output terminal pair and so operationally connected between current passing nodes of the first latch so as to prevent the first output terminal pair from floating;
- an input signal applying unit disposed between the current passing nodes of the first latch and a ground terminal, for each receiving the input signal pair;
- a ground switch disposed between the input signal applying unit and the ground terminal, and controlled and so turned on or off by the clock signal; and
- a delay reduction unit disposed between the input signal applying unit and the ground switch, for reducing a signal delay time of from a transition point of time when the clock signal is transited from a first logic level to a second output terminal pair.

33. The flip-flop of claim 32, wherein the sense amplifier-based flip-flop further comprises a high pass filter connected between the current passing nodes of the input signal applying unit, so as to prevent a degradation of output characteristic based on frequency even in a high frequency of the input signal pair.

* * * * *